US012796360B2

(12) United States Patent
Lin et al.

(10) Patent No.: US 12,796,360 B2
(45) Date of Patent: Nov. 10, 2026

(54) SEMICONDUCTOR STRUCTURES AND METHODS OF FORMING THE SAME

(71) Applicant: TAIWAN SEMICONDUCTOR MANUFACTURING COMPANY, LTD., Hsinchu (TW)

(72) Inventors: Han-Yu Lin, Hsinchu (TW); Tsung-Han Wu, New Taipei (TW); Bing-Hung Chen, New Taipei (TW); Yuan-Bang Lee, Miaoli (TW); Szu-Hua Chen, Tainan (TW); Pinyen Lin, Rochester, NY (US)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 177 days.

(21) Appl. No.: 18/932,822

(22) Filed: Oct. 31, 2024

(65) Prior Publication Data

US 2026/0123312 A1 Apr. 30, 2026

(51) Int. Cl.
*H10P 50/24* (2026.01)

(52) U.S. Cl.
CPC .................................. *H10P 50/244* (2026.01)

(58) Field of Classification Search
None
See application file for complete search history.

(56) References Cited

U.S. PATENT DOCUMENTS

| | | | | |
|---|---|---|---|---|
| 10,847,633 | B2 | 11/2020 | Jhan et al. | |
| 12,014,929 | B2 * | 6/2024 | Matsui | H10P 50/283 |
| 12,315,736 | B2 * | 5/2025 | Zhu | H01J 37/32 |
| 2023/0068619 | A1 * | 3/2023 | Chang | H10D 30/014 |
| 2026/0052716 | A1 * | 2/2026 | Lee | H10D 30/014 |

FOREIGN PATENT DOCUMENTS

| | | | |
|---|---|---|---|
| CN | 117766384 A * | 3/2024 | H10P 50/283 |
| TW | 202042301 | 11/2020 | |
| TW | 202145361 | 12/2021 | |

OTHER PUBLICATIONS

Substrate processing; machine translation of CN 117766384 A; (Year: 2024).*

* cited by examiner

*Primary Examiner* — Shamim Ahmed
(74) *Attorney, Agent, or Firm* — NZ Carr Law Office

(57) ABSTRACT

A plasmaless dry etching method is provided. A semiconductor structure including a dielectric layer formed on a substrate is placed into an etching chamber to perform the plasmaless dry etching method. A main etchant gas, a first gas, and a precursor are introduced into the chamber. During the etching process, a passivation source is created to impede a first byproduct created by reaction of the main etchant gas and the first gas with the dielectric layer and a second byproduct is created by a gas phase reaction between the first gas, the precursor gas, and the main etchant.

20 Claims, 20 Drawing Sheets

SEMICONDUCTOR STRUCTURES AND METHODS OF FORMING THE SAME

BACKGROUND

As the semiconductor industry introduces new generations of integrated circuits (IC) having higher performance and more functionality, the density of the elements forming the ICs increases, while the dimensions, sizes and spacing between components or elements are reduced. The semiconductor industry continues to improve the integration density of various electronic components (e.g., transistors, diodes, resistors, capacitors, etc.) by continual reductions in minimum feature size, which allow more components to be integrated into a given area.

An etching operation of a dielectric later is often performed in a semiconductor manufacturing process. However, with a decreasing dimension of a semiconductor device, a gap between two adjacent structures becomes smaller. That is, an aspect ratio is increased. To remove a dielectric layer with a high aspect ratio without causing damages to the adjacent structuring, an etching operation having sufficient selectivity between the dielectric layer and the adjacent structures is required.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
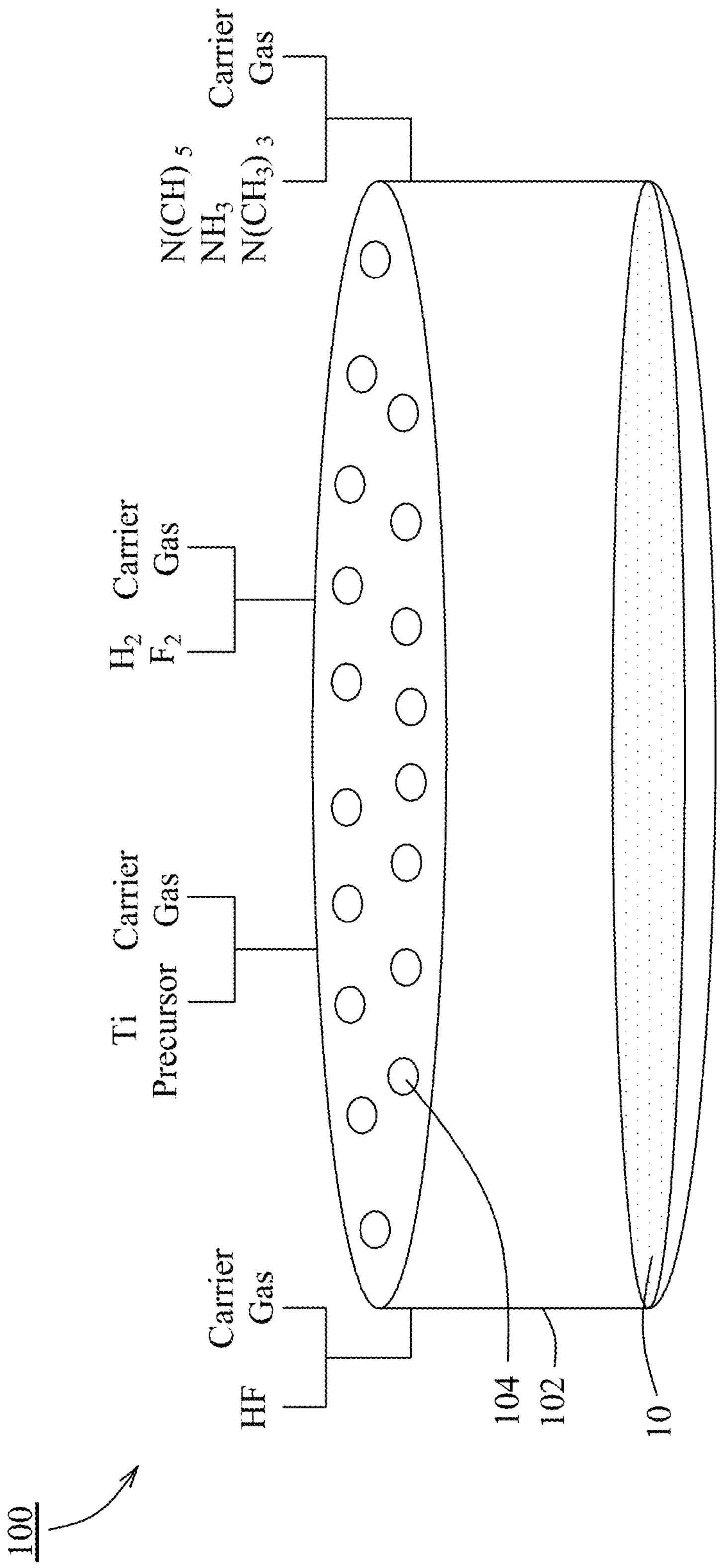
FIG. 1 shows a dry etch chamber according to some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "over," "on," "top," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As critical dimension of semiconductor structures is continuously decreased, more and more applications require highly selective and isotropic etching. Plasmaless chemical dry etch has been used to isotopically remove various materials such as $SiO_2$, SiON, SiOC, SiN and Si or other Si-related materials as it provides much higher selectivity compared to wet etching process and plasma-based etching process. The plasmaless feature also prevents the structure from being damaged by the high-energy ion bombardment. In the plasmaless chemical etching processes, byproducts may be formed to manipulate etching profile and loading, which is a phenomenon in which etch rate changes depending on the aperture ratio of the exposed surface. When a plasmaless dry etcher uses anhydrous hydrogen fluoride (HF) as the main etchant source for etching $SiO_2$, $NH_3$ and may be added as solvent to react with $SiO_2$ since $SiO_2$ is hardly etched by anhydrous HF alone at a relatively low temperature. In some embodiments, other solvents such as $N(CH_3)_3$, $H_2O$, alcohol, or other materials may also assist in reaction of HF and $SiO_2$. The byproducts may include ammonium fluorosilicate (AFS, $(NH_4)_2SiF_4$). During the chemical dry etching process, the following reactions may occur:

$$4\ HF + SiO_2 \rightarrow SiF_{4(g)} + 2\ H_2O \quad (1)$$

$$4HF + SiO_2 + NH_3 \rightarrow SiF_{4(g)} + 2H_2O + NH_3 \quad (2)$$

$$2HF + 2NH_3 + SiF_4 \rightarrow (NH_4)_2SiF_{6(s)} \quad (3)$$

The byproducts $(NH_4)_2SiF_6$ may fill voids and cover the surface of the semiconductor device such that reaction surface may be the same at all areas of the substrate. The plasmaless chemical etching process may also be applied to remove other dielectric materials such as SiOC, SiON, SiN, or other similar materials. However, the byproducts created at the small gaps or vias tend to be more porous to cause difficulty to uniformly etch at all areas. The small-gap etching capability and process throughput may thus be limited, and seriously impact next node etching back performance. The excessive thickness or volume of the byproducts created by reaction with the exposed surface of the substrate may be retard the etching process. In addition, the gas-substrate reaction during the plasmaless dry etching process often creates an amorphous-type byproducts. The substances or grains in an amorphous-type byproduct are arranged without an orderly pattern and may act as barriers for diffusion of gas etchant. Consequently, the powder-like or amorphous-type byproduct has poor controls on etching profile and loading.

To improve the control of etching profile and loading during a plasmaless dry etching process, a method to replace the byproducts a created by gas-substrate reaction with byproducts created by a gas-phase rection is provided according to some embodiments. Anhydrous hydrogen fluorine (HF) or similar material may be used as main etchant source in the plasmaless dry etching process. FIG. 1 shows a plasmaless chemical dry etcher 100 according to some embodiments. In FIG. 1, the plasmaless chemical etcher 100 includes a chamber 102 capped with a showerhead 104. A wafer 10 is disposed at a bottom portion inside the chamber 102. Etchant gas HF may be introduced into the chamber 102 with carrier gases such as argon (Ar), nitrogen ($N_2$), and helium (He). The plasmaless chemical etching process using HF and $NH_3$ and $N(CH_3)_3$ may create byproducts by gas-substrate reaction, that is, reaction between the etchant gases and the materials such as $SiO_2$ of the exposed surface of the substrate as presented in formulas (1)-(3).

To create byproducts by gas-phase reaction instead of reaction between the exposed surface of the wafer 10, for example, $SiO_2$ layer formed on the substrate, with HF, $NH_3$, and $N(CH_3)_3$, precursors, for example, titanium (Ti) or Ti-related precursors may be introduced into the chamber 102 for performing the plasmaless dry etch. In addition to the Ti precursor, pyridine ($N(CH)_5$) may be introduced into the chamber 102 together with $NH_3$ and $N(CH_3)_5$. According to some embodiments, hydrogen ($H_2$) and fluorine ($F_2$) may also be introduced into the chamber 102 with carrier gas Ar, $N_2$, or He to assist in manipulating the etching profile and loading.

In some embodiments, the Ti precursor may include titanium tetrafluoride ($TF_4$), titanium chloride ($TCl_4$), titanium isoproxide $Ti_4(OCH_3)_{16}$, titanium (IV) butoxide ($Ti(OBu)_4$($Bu{=}{-}CH_2CH_2CH_2CH_3$), ammonium hexafuorotitanate ($(NH_4)_2TiF_6$), tetrakis (dimethylamino) titanium (TDMAT, $((CH_3)_2N)_4Ti$), tetrakis(diethylamino) titanium (TDEAT, $((C_2H_5)_2N)_4Ti$), tetrakis (ethylmethylamino) titanium (TEMAT, $((CH_3C_2H_5)N)_4Ti$), or other forms of Ti precursor. $TiF_4$ and $TiCl_4$ in gas phase may be supplied into the chamber 102 for the plasmaless chemical etch. Titanium isopropoxide, titanium (IV) butoxide, and ammonium hexafuorotitanate supplied to the chamber 102 may be a solute in a solvent to be vaporizer for the plasmaless dry etch. The TDMA, TDEAT, and TEMAT used as the precursor may be in liquid phase that needs to be vaporized for the plasmaless dry etching process. The Ti precursor may also be introduced into the chamber 102 with similar carrier gases such as Ar, $N_2$, and He. Various types of Ti precursors and the forms or phases thereof may be referred to Table I.

TABLE I

| Ti precursor | Forms |
|---|---|
| $TiF_4$ | Gas |
| $TiCl_4$ | Gas |
| Titanium isopropoxide $Ti_4(OCH_3)_{16}$ | Solute |
| Titanium(IV) butoxide $Ti(OBu)_4$ ($Bu = {-}CH_2CH_2CH_2CH_3$) | Solute |
| Ammonium hexaflourotitanate, $(NH_4)_2TiF_6$ | Solute |
| Tetrakis (dimethylamino) titanium (TDMAT, $(CH_3)_2N)_4Ti$) | Liquid |

TABLE I-continued

| Ti precursor | Forms |
|---|---|
| tetrakis (diethylamino) titanium (TDEAT, $((C_2H_5)_2N)_4Ti$ | Liquid |
| tetrakis(ethylmethylamino) titanium (TEMAT, $(CH_3C_2H_5)N)_4Ti$) | Liquid |

According to some embodiments, $SiO_2$ may be etched through the reaction with HF mixed with selitane as:

$$SiO_2 + HF/selitane \leftrightarrow Si(OH)_{4-x}F_x + xH_2O_{(g)} \tag{4}$$

Figure 2:
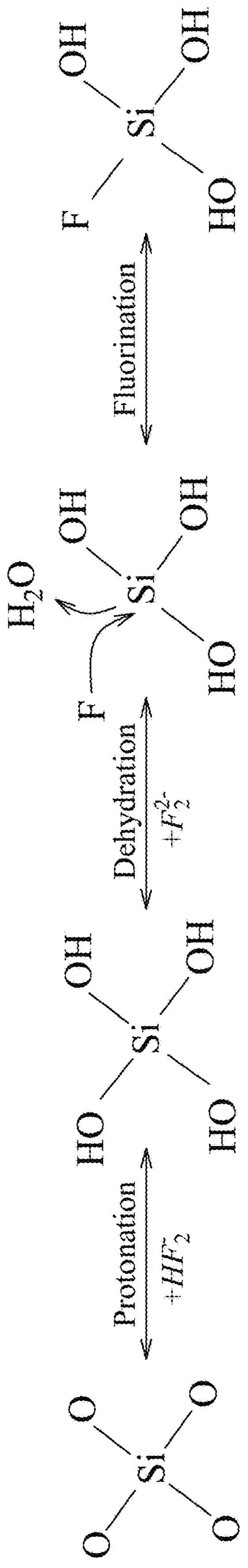
FIG. 2 shows etching reactions of $SiO_2$ in a plasmaless dry etching process according to some embodiment.

Selitane used in formula (4) may include 95% of isopropyl alcohol (IPA) and 5% of pyrine $N(CH)_5$ according to some embodiments. The reaction in formula (4) can be broken down into individual reactions as shown in FIG. 2. At the beginning of the reaction, $SiO_2$ is protonated by capturing a proton or a hydron ($H^+$) from HF. HF becomes $HF_2^-$ after being deprived with a hydron. $HF_2^-$ is then dehydronated into $F_2^{2-}$ to combine with $Si(OH)_4$, and fluorinated into $SiF_x(OH)_{4-x}$ after $H_2O$ is removed. In some embodiments, the dehydrogenation process may be impeded by adding $H_2$. While $SiO_2$ may be removed by the reaction presented in formula (4), byproducts may also be created by gas-substrate reaction, that is, the reaction between $SiO_2$ and pyridinium poly(hydrogen fluoride) ($(C_5H_5N{+}H)_2SiF_6^{2-}$ as shown in the following formula (5):

$$SiO_2 + C_5H_5N^+H(HF)_xF^- \rightarrow (C_5H_5N^+H)2SiF_6^{2-} + 2H_2O, \tag{5}$$

where $C_5H_5N^{H(HF)}{}_xF^-$ may be a compound of HF and pyridine, The gas-substrate reaction in formula (5) may be impeded by $SiF_x(OH)_y$ created from the reaction presented in formula (4). Therefore, $SiF_x(OH)_y$ may act as a passivation source to impede the gas-substrate reaction between $SiO_2$ and pyridinium poly(hydrogen fluoride). The introduction of pyridine causes creation of a passivation source which suppresses or impedes the creation of gas-substrate byproducts.

With the introduction of selitane and Ti precursor, byproducts may be formed from gas-phase reaction as shown in the following formula (6):

$$TiN + HF/selitane \leftrightarrow (HPyr)_2TiF_{6(s)} \leftrightarrow TiF_{6-x}(OH)_x + Pyr_{(g)} + H_{2(g)} \tag{6}$$

Figure 3:
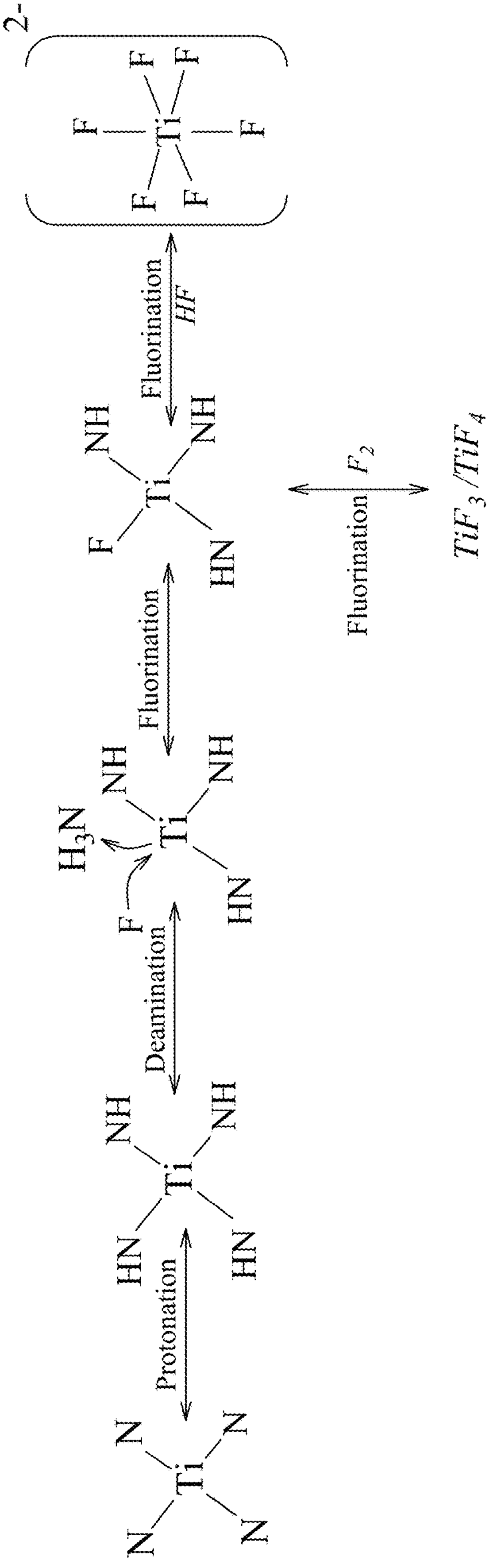
FIG. 3 shows the reaction for forming byproducts in a plasmaless dry etching according to some embodiment.
Figure 4:
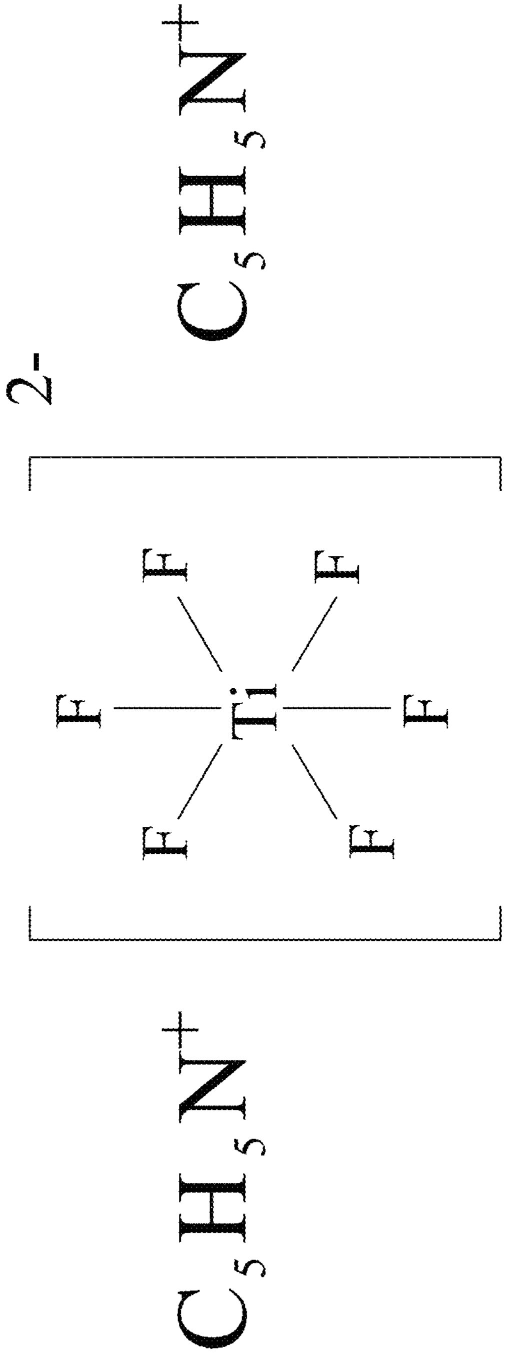
FIG. 4 shows the chemical structure of a byproduct created according to some embodiments.

$TiF_6$ of the by product PFT, that is, pyridinium hexafluorotitanate, may come from the breakdown reaction between TiN and HF as shown in FIG. 3. At the beginning of the reaction, Ti precursor such as TiN is protonated into $Ti(NH)_4$. $Ti(NH)_4$ is then deaminated and fluorinated. That is, $H_3N$ is removed from $Ti(NH)_4$ and F is combined with the deaminated $Ti(NH)_4$ to form $Ti(NH)_3F$. Further fluorination may also occur to create $TiF_6$ and HF, or alternatively, $TiF_3$ or $TiF_4$ with $F_2$. $TiF_6$ is then combined with pyridine to create byproduct PFT ($(HPyr)_2TF_6$), where HPyr is $N(CH)_5H$. The chemical structure of the byproduct may be referred to the structure as shown in FIG. 4. The $(HPyr)_2TiF_6$ may be decomposed into $TiF_{6-x}OH_x$, Pyr, and $H_2$. A reverse reaction from $TiF_{6-x}(OH)_x$, Pyr, and $H_2$ to PFT may also occur. When $TiO_2$ exists in the plasmaless dry etching process, the byproduct PFT may also be created from the reaction presented in formula (7) as:

$$TiO_2 + C_5N_5N^+H(HF)_xF^- \rightarrow (C_5H_5NH)_2TiF_6 + H_2O \quad (7)$$

According to some embodiments, the PFT byproduct may be removed by a in-situ subsequent process with introduction of $F_2$ into the chamber 102. When PFT byproduct is formed in a plasmaless dry etching process for etching $SiO_2$ at an etching temperature about 80° C., and a pressure is controlled of about 8 Torr. The flow rate of HF gas is about 800 sccm, a flow rate of selitane is about 1 g/min, a flow rate of $N_2$ is about 3500 sccm, and a flow rate of carrier gas $N_2$ is about 500 sccm, the PFT byproduct may be partially removed at 134 second of etching process without introduction of additional $H_2$ and/or $F_2$. In contrast, when additional $F_2$ with a flow rate of about 100 sccm is added at 100 second of etching process, a substantially complete removal of the byproduct PFT may be achieved.

Figure 5A:
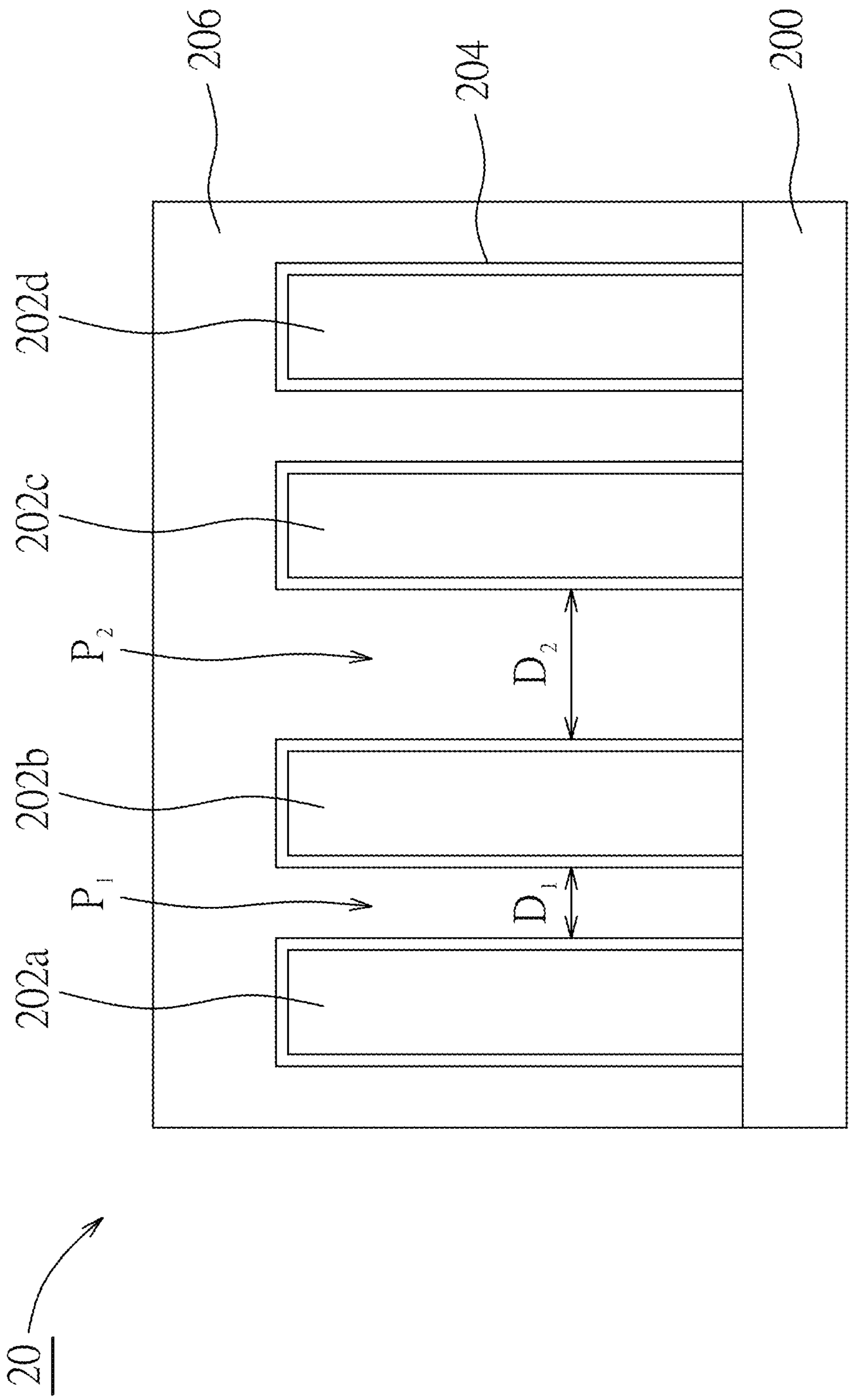
FIG. 5A shows a semiconductor structure subject to a plasmaless dry etching according to some embodiments.
Figure 5B:
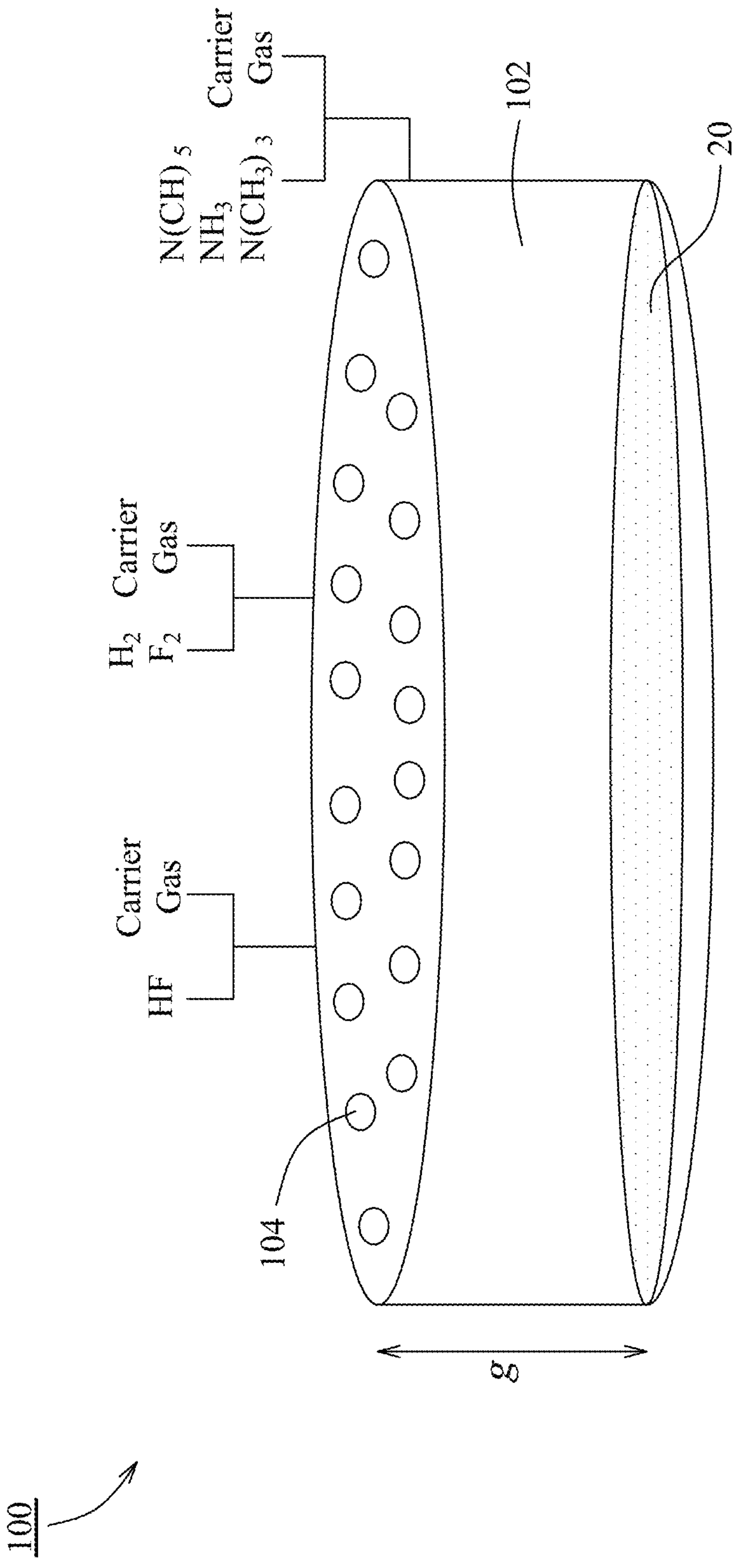
FIG. 5B shows an etching chamber used to perform a plasmaless dry etching process on the semiconductor structure as shown in FIG. 5A.

FIG. 5A is a cross-section of a semiconductor structure 20, and FIG. 5B shows the dry etcher 100 used for performing gas-phase chemical etching on the semiconductor structure 20. The etching front and cross-patterning behavior of SiOC may be investigated with the set up as shown in FIG. 5B. Referring to FIG. 5A, the semiconductor structure 20 includes a substrate 200 and various structures or features built therein or thereon. For example, the semiconductor structure 20 includes a substrate 200 and multiple fin structures 202 including, for example, semiconductor fins 202*a*, 202*b*, 202*c*, and 202*d* extending from the substrate 200. The fin structures 202 are spaced with each other with various distances. A liner layer 204 is conformally formed on the substrate 200 and the fin structures 202. As shown in FIG. 5A, the space $P_1$ between the semiconductor fins 202*a* has a pitch $D_1$ smaller than the pitch $D_2$ of the space $P_2$ between the semiconductor fins 202*b* and 202*c*. A dielectric layer 206 is then formed over the liner layer 204 and fills the gaps between the fin structures 202.

The substrate 200 may be a silicon (Si) substrate according to some embodiments. Alternatively, the substrate 200 may include other semiconductor materials such as germanium (Ge), a compound semiconductor such as silicon carbide, gallium arsenic, gallium phosphide, indium phosphide, indium arsenide, and/or indium antimonide, an alloy semiconductor including SiGe, GaAsP, AlInAs, AlGaAs, GaInAs, GaInP, and/or GaInAsP; or combinations thereof. The substrate 200 may be uniform in composition or may include various layers, some of which may be selectively etched to form the fins. The layers may have similar or different compositions, and in various embodiments, some substrate layers have non-uniform compositions to induce device strain and thereby tune device performance. Examples of layered substrates include semiconductor-on-insulator (SOI) substrates 200 having a buried dielectric layer. In some such examples, a layer of the substrate 200 may include an insulator such as a silicon oxide, a silicon nitride, a silicon oxynitride, a silicon carbide, and/or other suitable insulator materials.

The semiconductor fins 202*a* to 202*d* may include one or more semiconductor materials such as silicon, germanium, or silicon germanium (SiGe). In some embodiment, each of the semiconductor fins 202*a* to 202*d* may include multiple different semiconductor layers stacked one over the other. The semiconductor fins 202*a* to 202*d* may be formed by suitable processes including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers, or mandrels, may then be used to pattern the semiconductor fins 202*a* to 202*d* by etching initial epitaxial semiconductor layers of the substrate 200. The etching process can include dry etching, wet etching, reactive ion etching (RIE), and/or other suitable processes.

Referring to FIG. 5A, the distance $D_1$ of the gap $P_1$ between the semiconductor fin 202*a* and the semiconductor fin 202*b* is about 7 nm, and the distance of the gap $P_2$ between the semiconductor fin 202*b* and the semiconductor fin 202*c* is about 45 nm. The conformal liner 204 may include TiN or other Ti-related materials. According to some embodiments, the dielectric layer may include SiOC with 30.3% of Si, 62.3% of O, and 7.4% of C, and the etching front and patterning behavior of the SiOC result from a gas-phase chemical reaction occurring in the plasmaless dry etching process is investigated. Referring to FIG. 5B, the semiconductor device 20 is placed in the chamber 1000 with a distance g between the top of the chamber 101 and the semiconductor device 20. The distance g may be adjustable within a range between about 2 mm to about 100 mm. HF, $H_2$, $F_2$, $N(CH)_5$, $NH_3$, and $N(CH_3)_3$ are introduced into the chamber 100 with carrier gas such as Ar, $N_2$, and/or He. The plasmaless dry etching process may be performed under a pressure of about 0.1 Torr to about 10 Torr, and the temperature of the semiconductor device 20 is controlled at a range of about 25° C. to about 600° C. As the semiconductor fins 202*a* to 202*d* are covered with the liner layer 204 that contain Ti, the source of Ti precursor for creating gas-phase byproduct may come from the liner layer 204. Therefore, as shown in FIG. 5B, no addition Ti precursors is introduced to the chamber 102.

According to some embodiments, the plasmaless dry etching conditions include an etching temperature, that is, temperature of the semiconductor device 20, controlled at about 80° C., a pressure of about 4 Torr, a flow rate of HF about 400 sccm, a flow rate of selitane, for example, a mixture of 95% of isopropyl alcohol (IPA) and 5% of pyrine $N(CH)_5$, about 0.5 g/min, a flow rate of $N_2$ about 3500 sccm, and a flow rate of carrier gas $N_2$ about 250 sccm. A byproduct may be created without reacting with SiOC under these etching conditions. It has been observed that byproduct created at $P_1$ between the semiconductor fins 202*a* and 202*b* has a thickness of about 192.7 nm when the etching process is performed for about 67 seconds, while the byproduct observed at $P_2$ between the semiconductor fins 202*b* and 202*c* has a thickness larger than about 233 nm. The byproducts are created in a gas phase without reacting with SiOC. When the plasmaless dry etching continues performing for 360 seconds, the thickness of the byproducts created between the semiconductor fins 202*a* and 202*b* increases to be larger than 233 nm. The byproduct is also observed at a corner of the semiconductor fin 202*b* with a thickness of about 3.6 nm while performing the plasmaless dry etching process for 167 seconds. The thickness of the byproduct at the corner of the semiconductor fin 202*b* increases to about 13.3 nm at 360 seconds of the etching process.

According to some embodiments where the plasmaless etching process is performed with etching conditions including a temperature of about 50° C., a pressure of about 0.7 Torr, a flow rate of HF of about 1000 sccm, a flow rate of selitane about 500 sccm, a flow rate of $N_2$ about 1000 sccm, and a flow rate of carrier gas $N_2$ about 1000 sccm according to some embodiments, polycrystalline byproduct is observed between the neighboring semiconductor fins 202*a*, 202*b*, 202*c*, and 202*d*. As discussed above, the byproducts created by gas-substrate reaction are often in powder-like structure or amorphous structure. In contrast, the byproducts created by the gas-phase reaction are in polycrystalline form in which grain boundary exists to manipulate the diffusion path of thermal etchant gas, so as to manipulate the etching profile and loading.

To investigate the influence of $H_2$ on the cross-patten and loading of the semiconductor device during or after performing the plasmaless dry etching, $H_2$ with various flow rates is introduced into the chamber with at the same etching time in several etching operations. The etching conditions may be controlled with an etching temperature at 80° C., a pressure of about 8 Torr, a flow rate of HF about 800 sccm, a flow rate of selitane about 1 g/min, a flow rate of $N_2$ about 3500 sccm, and a flow rate of carrier gas $N_2$ about 500 sccm. When the etching process has been performed for 67 seconds, $H_2$ may be introduced into the chamber 100 with a flow rate of 0 sccm, 50 sccm, 100 sccm, and 200 sccm in four different etching operations, respectively. It has been observed that the irregularity of the SiOC etching front varies with the flow rates of $H_2$. The irregularity may be quantified by the loading measurement. The loading effect can be derived from etching rate variances across a semiconductor device. The empirical data show that the loading with 0 sccm, 50 sccm, 100 sccm, and 200 sccm are about 15.3 nm, 5.8 nm, 4.5 nm, and 0.4 nm between the semiconductor fins 202*b* and 202*c*. This shows that the introduction of $H_2$ into the chamber during the plasmaless dry etching process helps significantly in manipulating irregularity or irregular profiles of the SiOC front.

Table II shows the influence of $H_2$ on profiling the SiOC at different locations of the semiconductor structure when the etching processing proceeds at different etching time. In Table II, the depth of SiOC at both $P_1$ and $P_2$ is about 161±6 nm at the beginning of the plasmaless dry etching process. At 67 second of the etching process, the depth of SiOC at $P_1$ drops to about 119±6 nm and 118.8±5.6 nm with 0 sccm of $H_2$ and 100 sccm of $H_2$, respectively. The thickness of SiOC at $P_1$ drops to about 135.0±11.2 nm with 0 sccm of $H_2$ at 100 seconds, and to 137.5±15.7 nm with 100 sccm of $H_2$ at 90 second. At 67 second of the etching process, the depth of SiOC at $P_2$ drops to about 134.4±11.4 and 123.4±16.1 nm with 0 sccm and 100 sccm of $H_2$, respectively. However, at 100 second of the etching time, the depth of SiOC at $P_2$ increases to 216±15.4 nm when 0 sccm of $H_2$ is introduced. In contrast, the depth of SiOC etching from drops to about 153.2±13 nm with 100 sccm of $H_2$ at 90 second of the etching time. The overall loading of the semiconductor structure decreases from about 15.3 nm to about 4.5 nm when the flow rate of $H_2$ increases from 0 sccm to 80 sccm at 67 second of the etching time. The overall loading is about 76 nm with 0 sccm of $H_2$ at 100 second, while the loading is about 15.6 at 90 second of the etching time with 100 sccm of $H_2$. This further shows the significant influence of $H_2$ on etching profile and loading introduced during the plasmaless dry etching process. Table II also shows that the SiOC etching front at $P_2$ has a hump shape at 67 seconds with or without introduction of $H_2$. The hump shape maintains at 100 second of the etching time when no $H_2$ is introduced. In contrast, when 100 sccm of $H_2$ is introduced, the shape changes to a smiling shape. The irregularity of the SiOC profile is also mitigated with the introduction of $H_2$.

TABLE II

| Flow rate of $H_2$ (sccm) | | 0 | | 100 | |
|---|---|---|---|---|---|
| Etch Time (s) | | 67 | 100 | 67 | 100 |
| SiOC depth at $P_1$ (nm) | | 119 ± 6 | 135 ± 11.2 | 118.8 ± 5.6 | 137.5 ± 15.7 |
| SiOC depth at $P_2$ (nm) | | 134.4 ± 11.4 | 216 ± 15.4 | 123.4 ± 16 | 153.2 ± 13 |
| Loading (nm) | | 15.3 | 76 | 4.5 | 15.6 |
| | Shape | Hump | Hump | Hump | Smiling |
| SiOC profile at $P_2$ (nm) | Mean | 16.5 | 14.7 | 5.4 | 14.8 |
| | $3\sigma$ | 20.1 | 21.1 | 7.43 | 11.6 |
| TiN loss | | 0.1 | 0.78 | 0.9 | 0.8 |

The plasmaless dry etching process may be applied at various stages of a fabrication process of various types of semiconductor devices. For example, the plasmaless dry etching process may be used to etch an interlayer dielectric (ILD) over and within fin structures spaced with each other by gaps in different dimensions. The plasmaless dry etching process may also be applied to etch the dielectric layer during the process for forming inner spacers. FIGS. 6-11 show cross-sectional views of a semiconductor structure formed at various fabrication stages. The semiconductor structure may include an FET such as a fin field effect transistor (finFET), a gate-all-around finFET (GAAfinFET), and/or other semiconductor devices.

The wafer footprint of an FET is related to the electrical conductivity of the channel material. If the channel material has a relatively high conductivity, the FET can be made with a correspondingly smaller wafer footprint. A method of increasing channel conductivity and decreasing FET size is to form the channel as a nanostructure. In a GAA configuration, a nanosheet-based FET includes a source region, a drain region and stacked nanosheet channels between the source and drain regions. A gate surrounds the stacked nanosheet channels and regulates electron flow through the nanosheet channels between the source and drain regions. GAA nanosheet FETs are fabricated by forming alternating layers of channel nanosheets and sacrificial nanosheets. The sacrificial nanosheets are released from the channel nanosheets before the FET device is finalized. For n-type FETs, the channel nanosheets are typically silicon (Si) and the sacrificial nanosheets are typically silicon germanium (SiGe). For p-type FETs, the channel nanosheets can be SiGe and the sacrificial nanosheets can be Si. According to some embodiments, the channel nanosheet of a p-type FET can be SiGe or Si, and the sacrificial nanosheets can be Si or SiGe. Forming the GAA nanosheets from alternating layers of channel nanosheets formed from a first type of semiconductor material (e.g., Si for n-type FETs, and SiGe for p-type FETs) and sacrificial nanosheets formed from a second type of semiconductor material (e.g., SiGe for n-type FETs, and Si for p-type FETs) provides superior channel electrostatics control, which is necessary for continuously scaling gate lengths down to seven 7 nanometer CMOS technology and below. The use of multiple layered SiGe/Si sacrificial/channel nanosheets (or Si/SiGe sacrificial/channel nanosheets) to form the channel regions in GAAFET semiconductor devices provides desirable device characteristics, including the introduction of strain at the interface between SiGe and Si.

Figure 6:
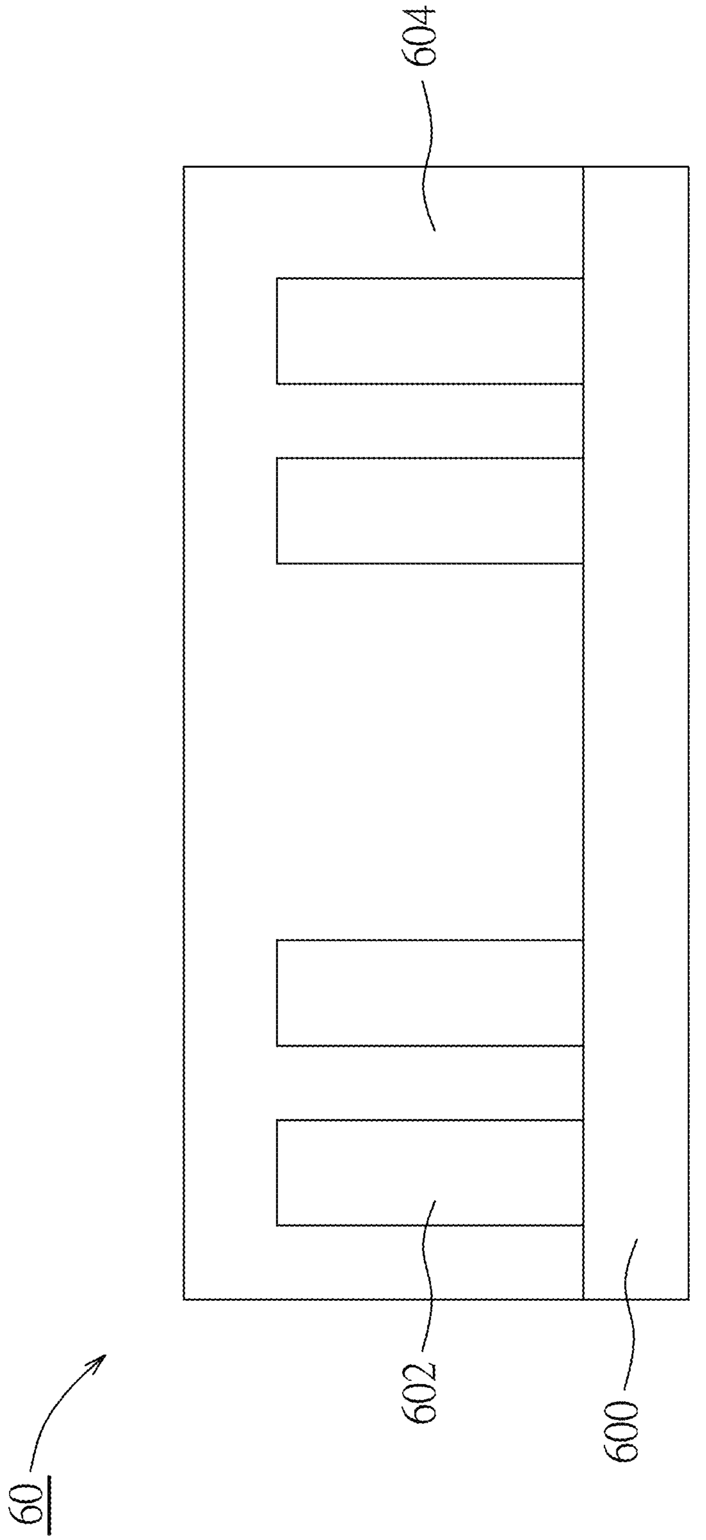
FIGS. 6-11 are cross-sectional views of a semiconductor device at various stages of a fabrication process according to some embodiments.
Figure 7:
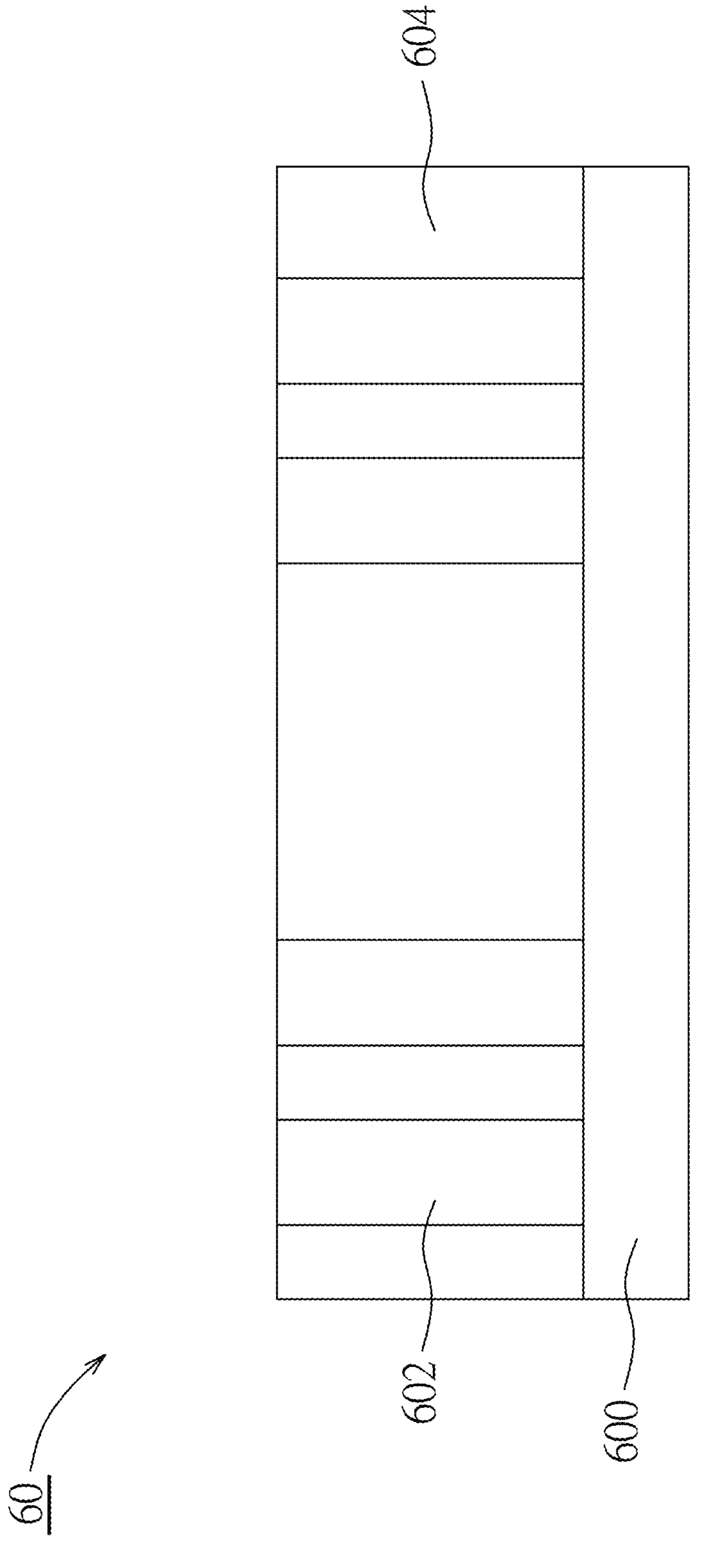

FIG. 6 shows a cross-sectional view of a semiconductor structure 6 including a nanosheet structure. The semiconductor structure 60 includes a substrate 600 and semiconductor fins 602 such as nanosheets extending from the substrate 600. The semiconductor fins 602 may include stacks of discrete Si layers when the semiconductor structure 60 includes n-type FETs. For p-type FETs, the semiconductor fins? 602 may include stacks of discrete SiGe layers. An interlayer dielectric (ILD) layer 604 is formed to fill the gaps between the semiconductor fins 602 and cover the semiconductor structure 60. The ILD layer 604 may be formed from $SiO_2$, $SiO_xC_yN_z$, SiOC, SiON, SN, or other Si-containing dielectric material. According to some embodiments, the ILD layer 604 may include SiO-based dielectric layer materials such as tetra ethyl ortho silicate (TEOS), PECVD $SiO_2$, phosphor-silicate glass (BSG), boron-doped phosphor-silicate glass (BPSG), or the similar materials. A planarization process such as chemical mechanical polish (CMP) process or a mechanical grinding process may be performed until the semiconductor fins 602 are exposed as shown in FIG. 7.

Figure 8:
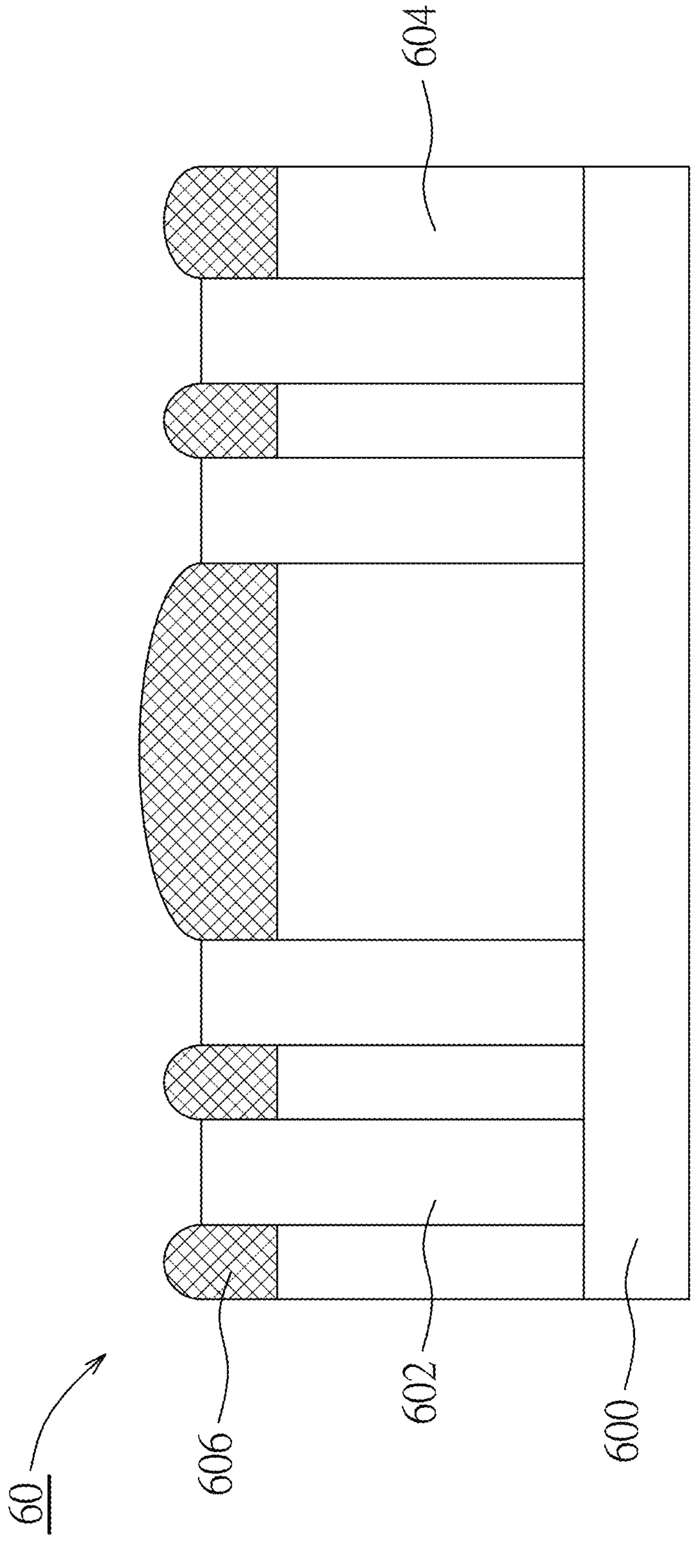

In FIG. 8, a plasmaless dry etching process is performed to etch the ILD layer 604. The dry etcher 100 and the etchant sources as shown in FIG. 1 may be used to perform the plasmaless dry etching process. Referring to FIG. 1, HF, $N(CH)_5$, $H_2$, $N_2$, $F_2$, and Ti precursor are introduced into the chamber 102 to perform the plasmaless dry etching process. According to some embodiments, HF, $N(CH)_5$, $H_2$, $N_2$, $F_2$, and Ti precursor in gas phase are supplied into the chamber 102. The flow rate of HF gas may range from about 20 sccm to about 1000 sccm. The flow rate of N(CH) s gas may range from about 0.1 g/min to about 3 g/min. The $H_2$ gas may have a flow rate from about 20 sccm to about 1000 sccm. The $N_2$ gas may have a flow rate of about 20 sccm to about 5000 sccm. The flow rate of $F_2$ gas may range from about 20 sccm to about 1000 sccm. The Ti precursor gas may have a flow rate ranging from about 20 sccm to about 1000 sccm. The pressure applied to the etching process may range from about 0.1 Torr to about 10 Torr. The distance from the semiconductor structure 60 to the entrance of the etchant may be adjusted between about 2 mm and about 100 mm.

During the plasmaless dry etching process, undesired byproducts may be created by the reaction between the etchant gas and the ILD layer 604. For example, when the ILD layer 604 is made of $SiO_2$, pyridinium poly(hydrogen fluoride) may be created as presented in formula (5). Such type of byproduct may cause issues in profiling small areas such as the gap between the semiconductor fins 602. However, the introduction of pyridine may also cause the etching operation on $SiO_2$ to create a product $Si(OH)_{4-x}F_x$ that may impede production of the undesired byproduct pyridinium poly(hydrogen fluoride).

Figure 9:
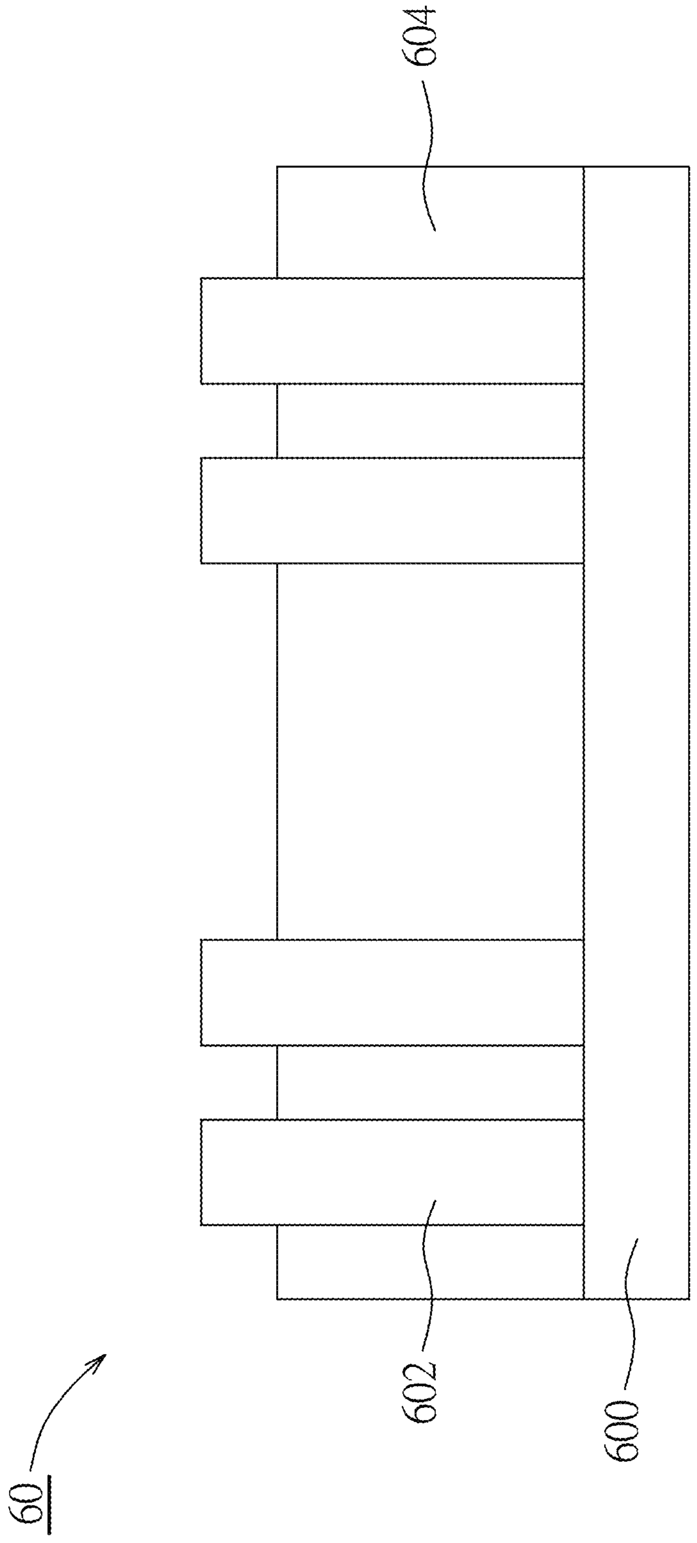
Figure 10:
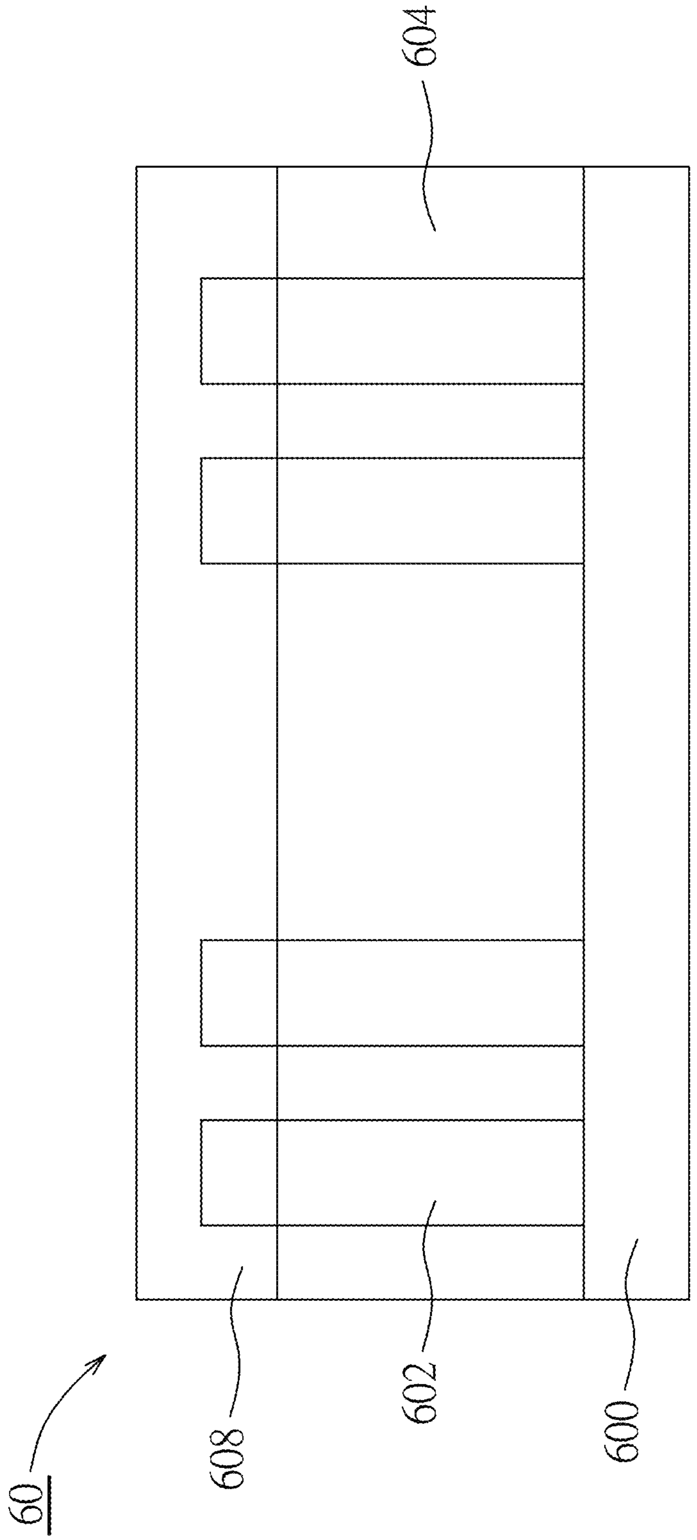
Figure 11:
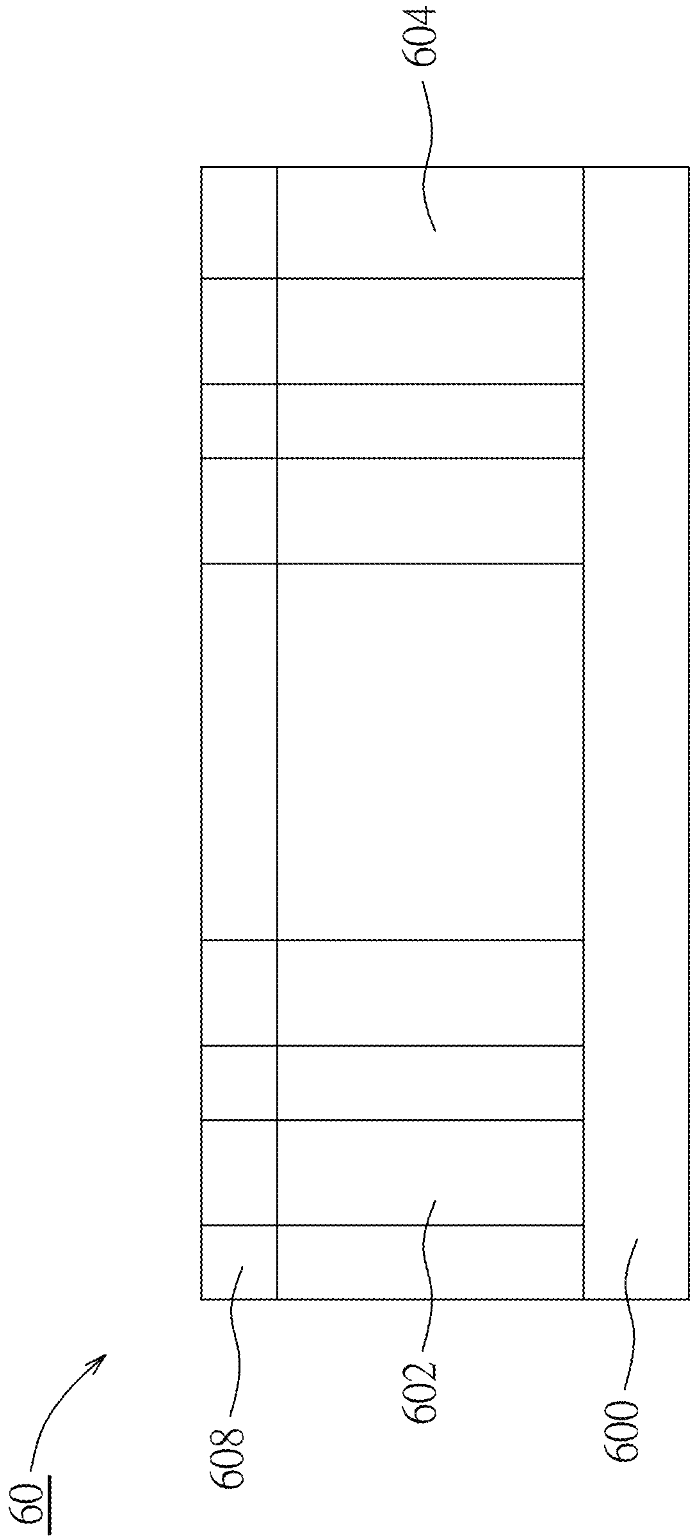

As shown in FIG. 8, byproducts 606 is created during the etching process. The byproducts 606 is created by reaction of the thermal etchant gases. As discussed above, solid PFT, that is, $(HPyr)_2TiF_6$ in a solid phase, may be created from reaction of Ti precursor gas, HF gas, and selitane without reacting with the exposed surface of the substrate, that is, the ILD layer 604. The Ti-containing byproduct 606 may be thinner than the byproduct created by gas-substrate reaction. In addition, the byproduct 606 may include a polycrystalline structure in which grain boundary exists to manipulate diffusion of the etchant gases. After a desired thickness of the ILD layer 604 is removed, as shown in FIG. 9, the byproduct 606 is removed to expose the remaining ILD layer 604. The removal of the byproduct 606 may be performed in an in-situ manner. For example, the byproducts 606 may be removed by continuously performing the plasmaless dry etching process without changing the etching conditions for a predetermined time. Or more efficiently, additional $F_2$ may be added into the chamber 102 at a predetermined time during the plasmaless dry etching process. In FIG. 10, a dielectric layer or a metal layer 608 may be formed to cover the ILD layer 604 and the semiconductor fins 602, followed by a planarization process such as CMP until the semiconductor fins 602 are exposed.

Figure 12:
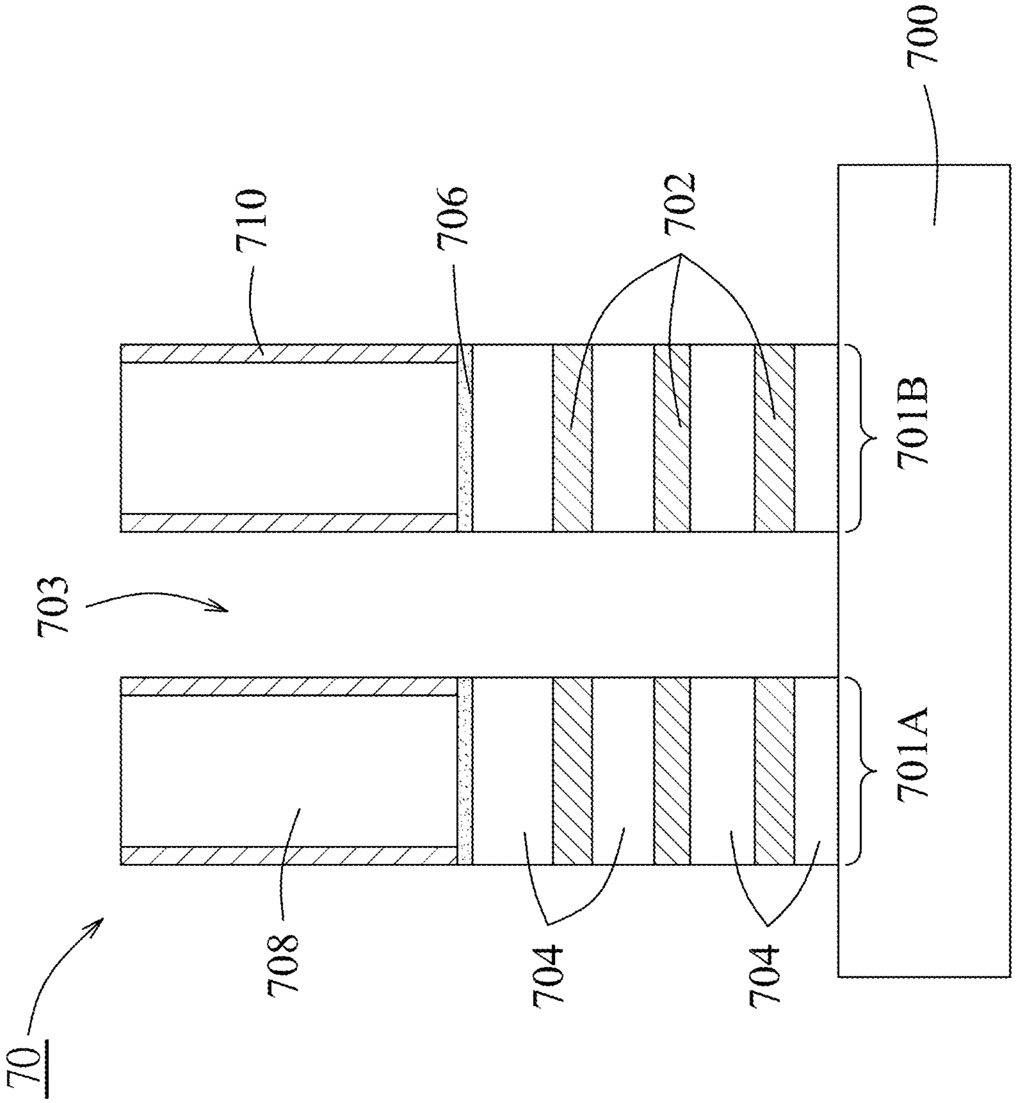
FIGS. 12-15 are cross-sectional views of a semiconductor device at various stages of a fabrication process according to some embodiments.

The plasmaless dry etching process may be applied to the fabrication process of various device structures, particularly for the structures including small vias, gaps, or spaces of which the profiling and loading cannot be properly controlled or manipulated with the byproduct created from gas-substrate reaction. For example, the plasmaless dry etching process may be used for forming inner spacers in a semiconductor device 70 as shown in FIGS. 12-15. Referring to FIG. 12, the semiconductor device 70 includes a GAAFET structures 701A and 701B formed on a substrate 700. Each of the GAAFET structures 701A and 701B includes a set of first semiconductor layers 702 and a set of second semiconductor layers 704 alternately stacked with each other. The first set of semiconductor layers 702 and second set of semiconductor layers 704 may be epitaxially grown on their underlying layer. A protective oxide layer 706 may be formed on each of the first and second sets of semiconductor layers 702 and 704. The semiconductor device 70 also includes a gate structure 708 formed on the protective oxide layer 706. A spacer 710 may be formed on the sidewall of each of the gate structure 708.

Figure 13:
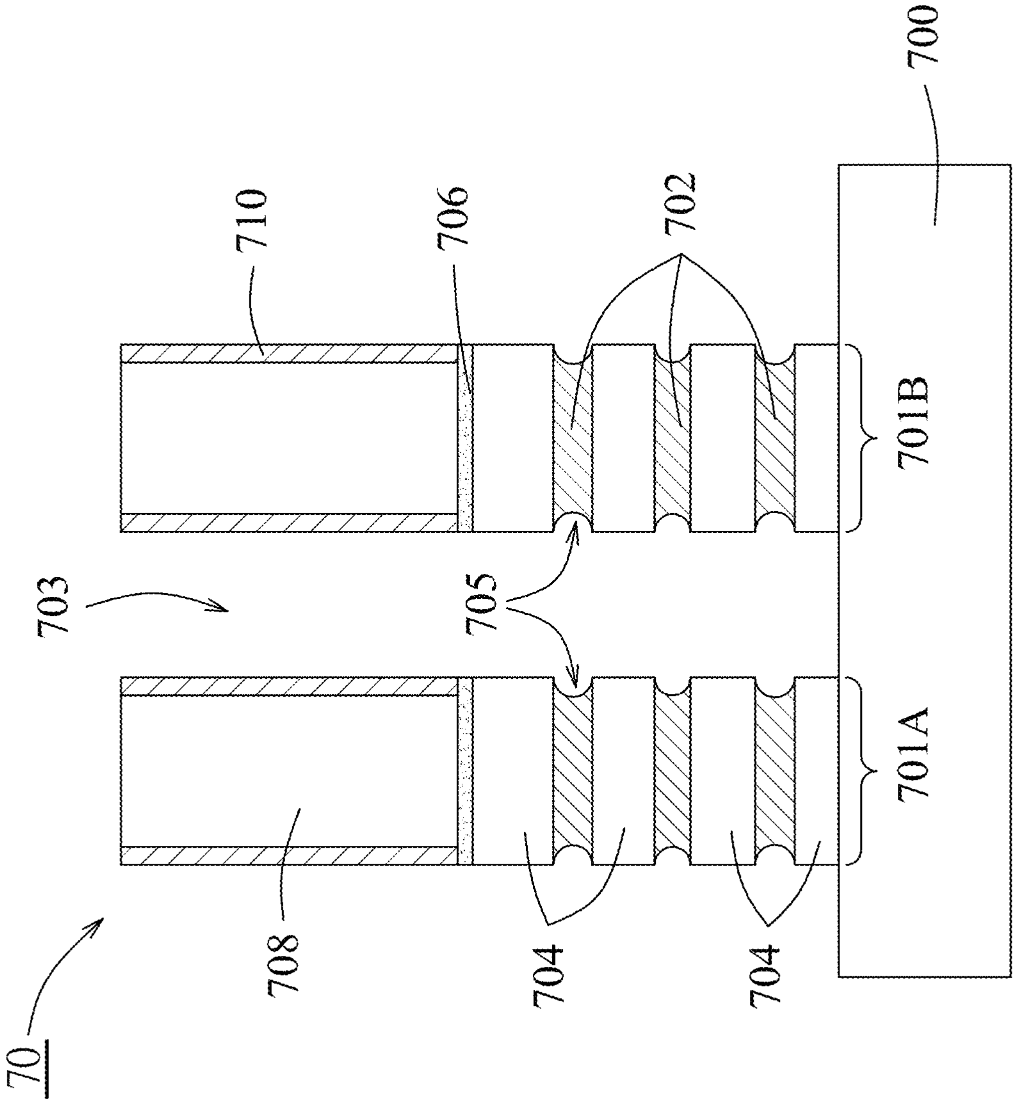

In FIG. 13, an etching process is performed to remove an edge portion of each of the second semiconductor layers 704. As a result, the sidewall of the second set of semiconductor layers 704 is recessed from the sidewalls of the pair of first semiconductor layers 702 immediately adjacent thereto. A cavity 705 is formed at the edge of each second semiconductor layers 704 as shown in FIG. 13. In some embodiments, the semiconductor layers 704 can be etched by a dry etching process. The dry etching process can include one or more fluorine-containing gases as main etchants. The fluorine-containing gases can include one or more of fluorine ($F_2$), hydrogen fluoride (HF), chlorine trifluoride ($ClF_3$), a fluorine radical (F), and a nitrogen trifluoride radical ($NF_3$). In some embodiments, edge portions of the semiconductor layers 704 can be removed by a gas phase etching using fluorine-containing gases, such as $F_2$, HF, and $ClF_3$. In some embodiments, semiconductor layers 704 can be etched by a radical phase etching using radicals, such as F, H, and $NF_3$, generated from fluorine-containing gases by a remote plasma system. The dry etching process can have by-products, such as silicon tetrafluoride ($SiF_4$) and germanium tetrafluoride ($GeF_4$).

Figure 14:
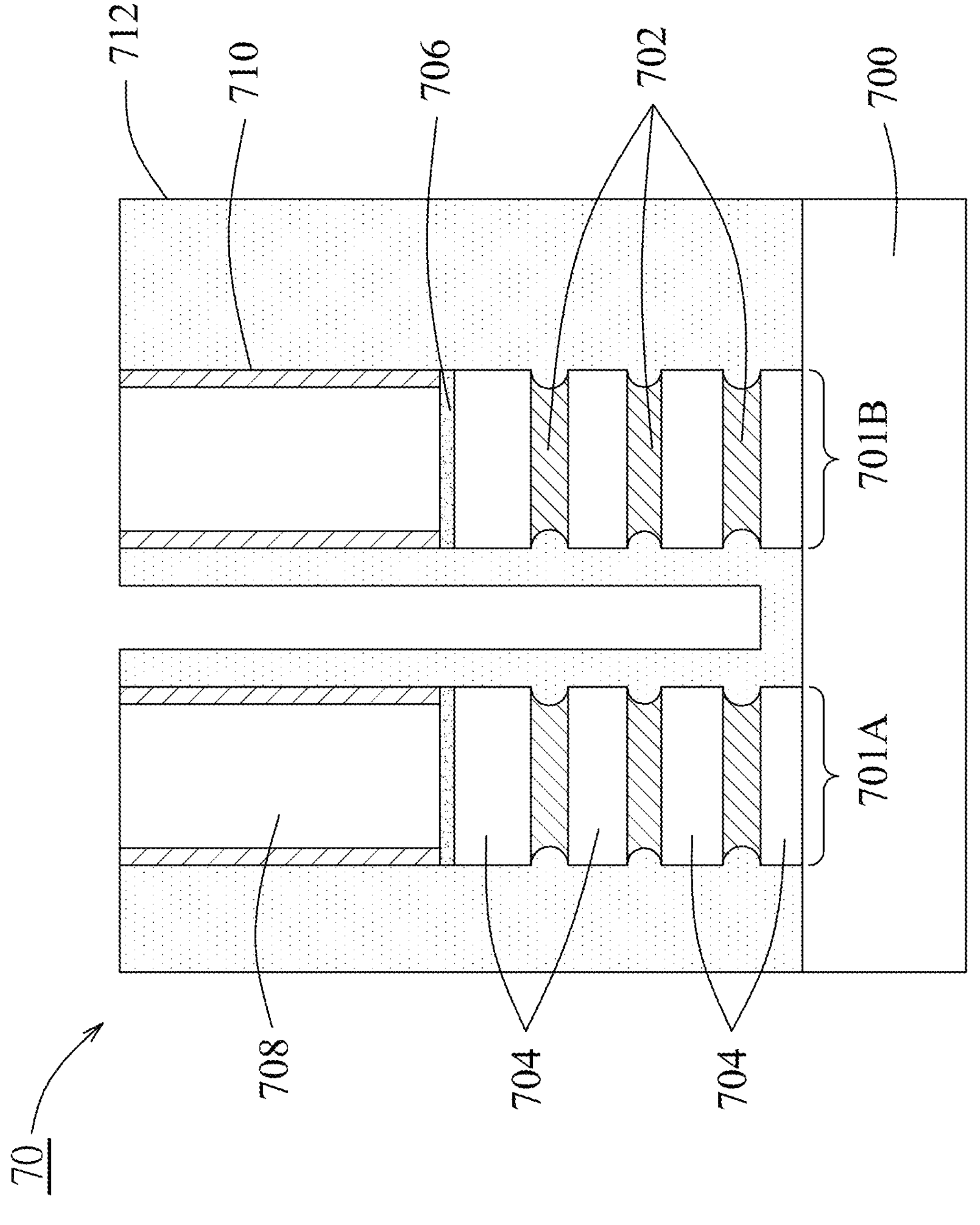

Referring to FIG. 14, to form inner spacers within the cavities 705 at the sidewalls of the second semiconductor layers 704, a blanket deposition of an inner spacer layer 712 is performed. In some embodiments, the inner spacer layer 712 may include a single layer or a stack of dielectric layers, deposited by atomic layer deposition (ALD), chemical vapor deposition (CVD), or other suitable methods. In some embodiments, the inner spacer layer 712 may include a dielectric material, such as silicon oxynitride (SiON), silicon carbonitride (SiCN), silicon oxycarbide (SiOC), silicon oxynitricarbide (SiOCN), silicon nitride ($SiN_x$), silicon oxide ($SiO_x$), and a combination thereof. The blanket deposition can fill openings 703 with the dielectric material and cover exposed surfaces of finFETs 701A and 702B.

A plasmaless dry etching process is performed to etch the inner spacer layer 712 according to some embodiments. The dry etcher and etchant sources used as shown in FIG. 1 may be used to perform the plasmaless dry etching process. Referring to FIG. 1, HF, $N(CH)_5$, $H_2$, $N_2$, $F_2$, and Ti precursor are introduced into the chamber 102 to perform the plasmaless dry etching process. According to some embodiments, HF, $N(CH)_5$, $H_2$, $N_2$, $F_2$, and Ti precursor are supplied into the chamber 102 in gas phase. The flow rate of HF gas may range from about 20 sccm to about 1000 sccm. The flow rate of $N(CH)_5$ gas may range from about 0.1 g/min to about 3 g/min. The $H_2$ gas may have a flow rate from about 20 sccm to about 1000 sccm. The $N_2$ gas may have a flow rate of about 20 sccm to about 5000 sccm. The flow rate of $F_2$ gas may range from about 20 sccm to about 1000 sccm. The Ti precursor gas may have a flow rate ranging from about 20 sccm to about 1000 sccm. The pressure applied to the etching process may range from about 0.1 Torr to about 10 Torr. The distance from the semiconductor structure 60 to the entrance of the etchant may be adjusted between about 2 mm and about 100 mm.

During the plasmaless etching process, undesired byproducts may be created from the reaction between the etchant gas and the inner spacer layer 712. For example, when the inner spacer layer 712 is made of $SiO_2$, byproduct pyridinium poly(hydrogen fluoride) may be created. Creation of such undesired byproducts may be impeded by $Si(OH)_{4-x}F_x$ created while etching $SiO_2$. That is, $Si(OH)_{4-x}F_x$ created during the etching process may serve as a passivation source of the undesired byproduct pyridinium poly(hydrogen fluoride).

Figure 15:
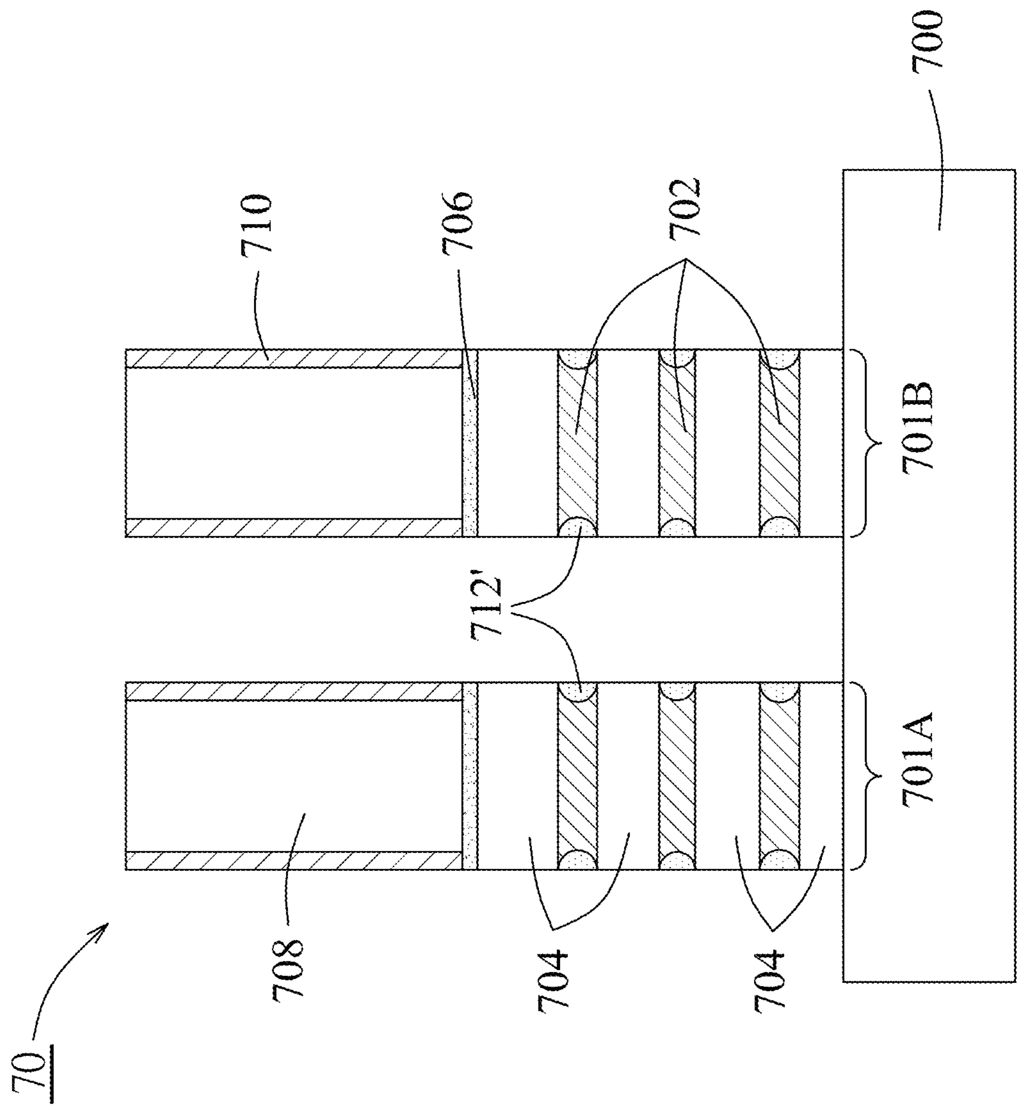

The introduction of Ti precursor and pyridine allows solid PFT, that is, solid-phase $(HPyr)_2TiF_6$, to be created from thermal gas reaction without reaction with the substrate, that is, the inner spacer layer 712. The byproduct may thus provide significant control in etching profile and loading. After the inner spacer layer 712 outside of the cavities 705 is removed, the byproduct can then be removed, and leaves to inner spacer layer 712' within the cavities to serve as inner spacers of the finFET 701A and 701B as shown in FIG. 15. The removal of the byproduct may be performed in an in-situ manner. For example, the byproducts may be removed by continuously performing the plasmaless dry etching process for a predetermined time. In some embodiments, additional $F_2$ may be added into the chamber at a predetermined time during the plasmaless dry etching process to improve the removal efficiency of the inner spacer layer 712.

Figure 16:
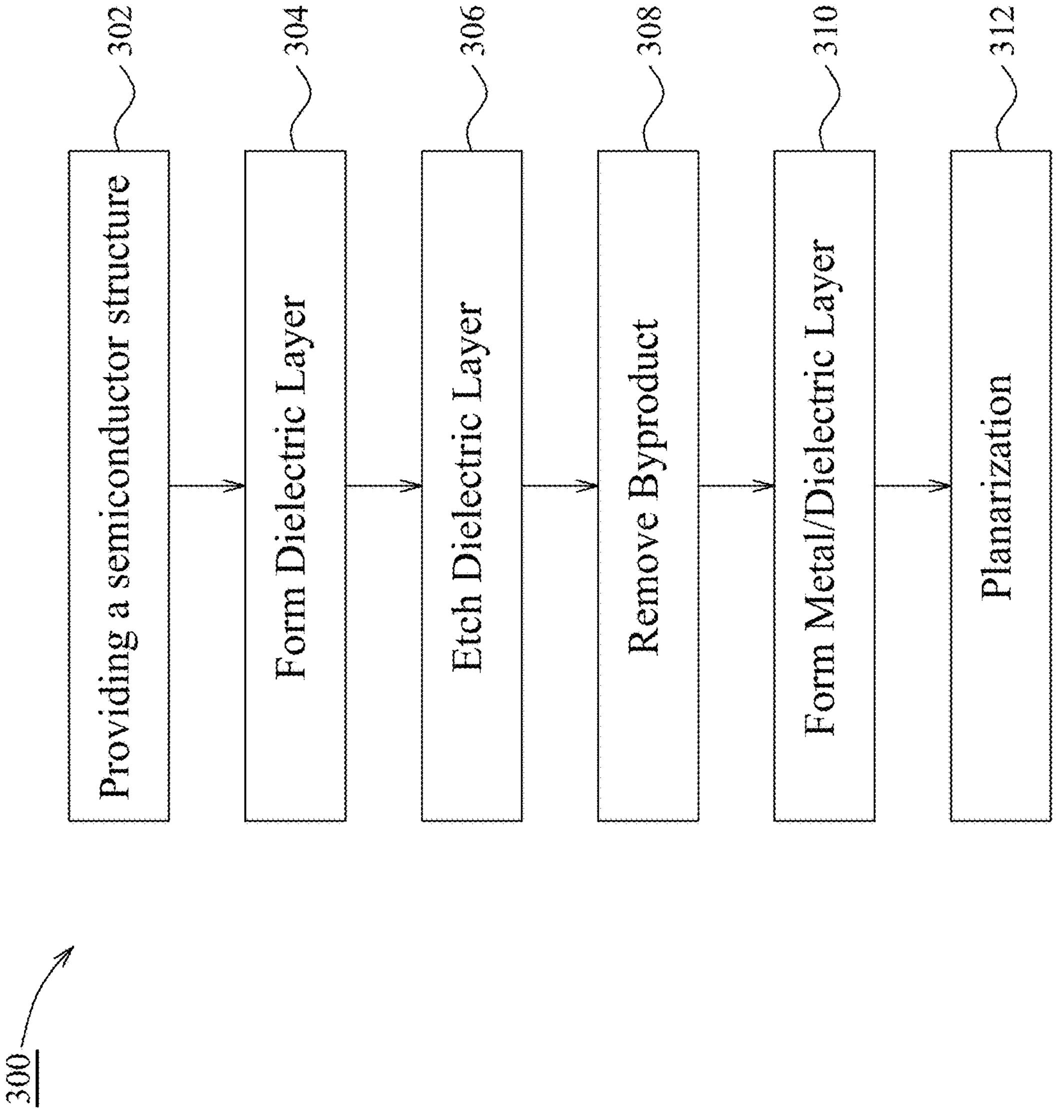
FIGS. 16-19 show various methods for forming a semiconductor device according to some embodiments.

FIG. 16 is a flow diagram of a method 300 for forming a semiconductor device according to some embodiments. The method 300 includes several operations or steps to form a semiconductor device with an improved profile and process throughput, for example, the semiconductor device 60 as shown in FIGS. 8-11. At operation 302, a substrate structure is formed. The semiconductor structure may include a substrate and various structures formed in or on the semiconductor. For example, fin structures may be formed on the substrate. The fin structures may be spaced with each other with various distances. In one embodiment, each of the fin structures may include a nanosheet structure, or alternately, a stack of first semiconductor layers and second semiconductor layers alternately stacked on the substrate. At operation 304, a dielectric layer is formed over the substrate. The dielectric layer covers the fin structures and fill the gaps between the fin structures. The dielectric layer may include $SiO_2$, $SiO_xC_yN_z$, SiOC, SiON, SN, or other Si-containing dielectric material. The dielectric layer is then etched at operation 306. According to some embodiments, a plasmaless isotropic dry etch is used etch the dielectric layer. Anhydrous HF may be used as the main etchant source. A precursor, for example, Ti precursor and pyridine are introduced in the plasmaless dry etch to create byproduct from a gas-phase reaction, while pyridine mixed with HF may cause a reaction between the dielectric layer and the main etchant HF to create a passivation source. When the dielectric layer includes $SiO_2$, $SiF_x(OH)_y$ may be formed to serve as the passivation source. The passivation source impedes creation of byproduct created by the gas-substrate reaction, that is, a reaction between the dielectric layer $SiO_2$ and a combination of pyridine and HF. Therefore, at operation 306, the byproduct created during the plasmaless dry etch is mainly those created by gas-phase reaction. When the dielectric layer includes $SiO_2$, the byproduct may include PFT, that is, $(HPyr)_2TiF_6$, in a solid phase. The PFT byproduct has a polycrystalline structure in which the grains are arranged with orderly grain boundaries through which the etchant gas may diffuse. Therefore, the existence of the grain boundaries may manipulate the diffusion of the etchant gases, so as to manipulate the etching profile and loading of the plasmaless dry etching process.

When a predetermined thickness of the dielectric layer has been removed by the plasmaless dry etch, the byproduct is removed at operation 308. The removal of the byproduct may be achieved in an in-situ manner. For example, the byproduct may be remove by continuously performing the plasmaless dry etching process for a predetermined period of time. To improve the removal efficiency, $F_2$ may be added in the removal process. The subsequent operations after the byproduct is removed may include formation of a metal or dielectric layer at operation 310 and a planarization process such as CMP performed on the metal or dielectric layer at operation 312.

Figure 17:
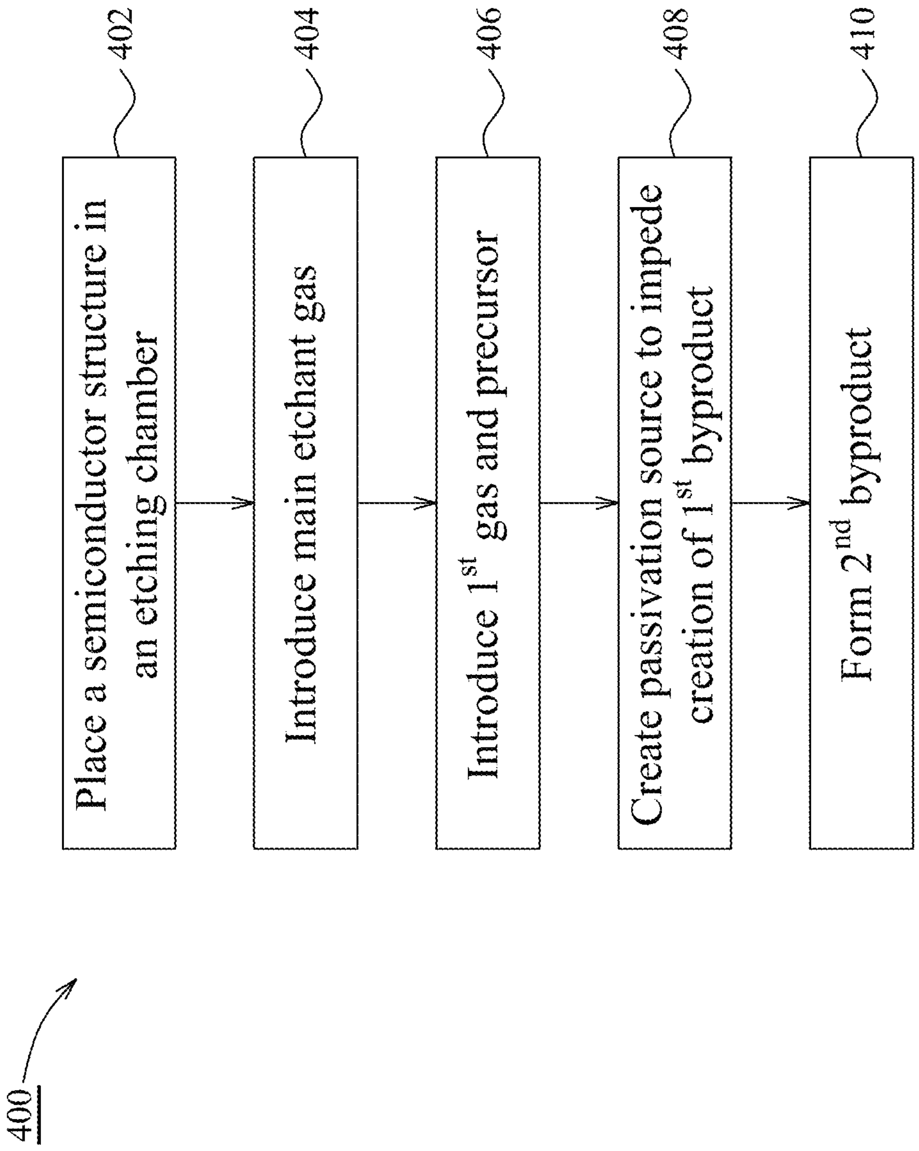

FIG. 17 is a flow diagram of a plasmaless dry etching method according to one embodiment. The method 400 includes several operations or steps to form a semiconductor device with an improved profile and process throughput. The plasmaless drying etching method 400 includes placing a semiconductor structure in an etching chamber at operation 402. A main etchant gas is introduced into the etching chamber at operation 404. At operation 406, a first gas and a precursor gas are also introduced into the etching chamber. A passivation source is created to impede a first byproduct created by reaction of the main etchant gas and the first gas with the dielectric layer at operation 408. At operation 410, a second byproduct is created by a gas phase reaction between the first gas, the precursor gas, and the main etchant gas.

Figure 18:
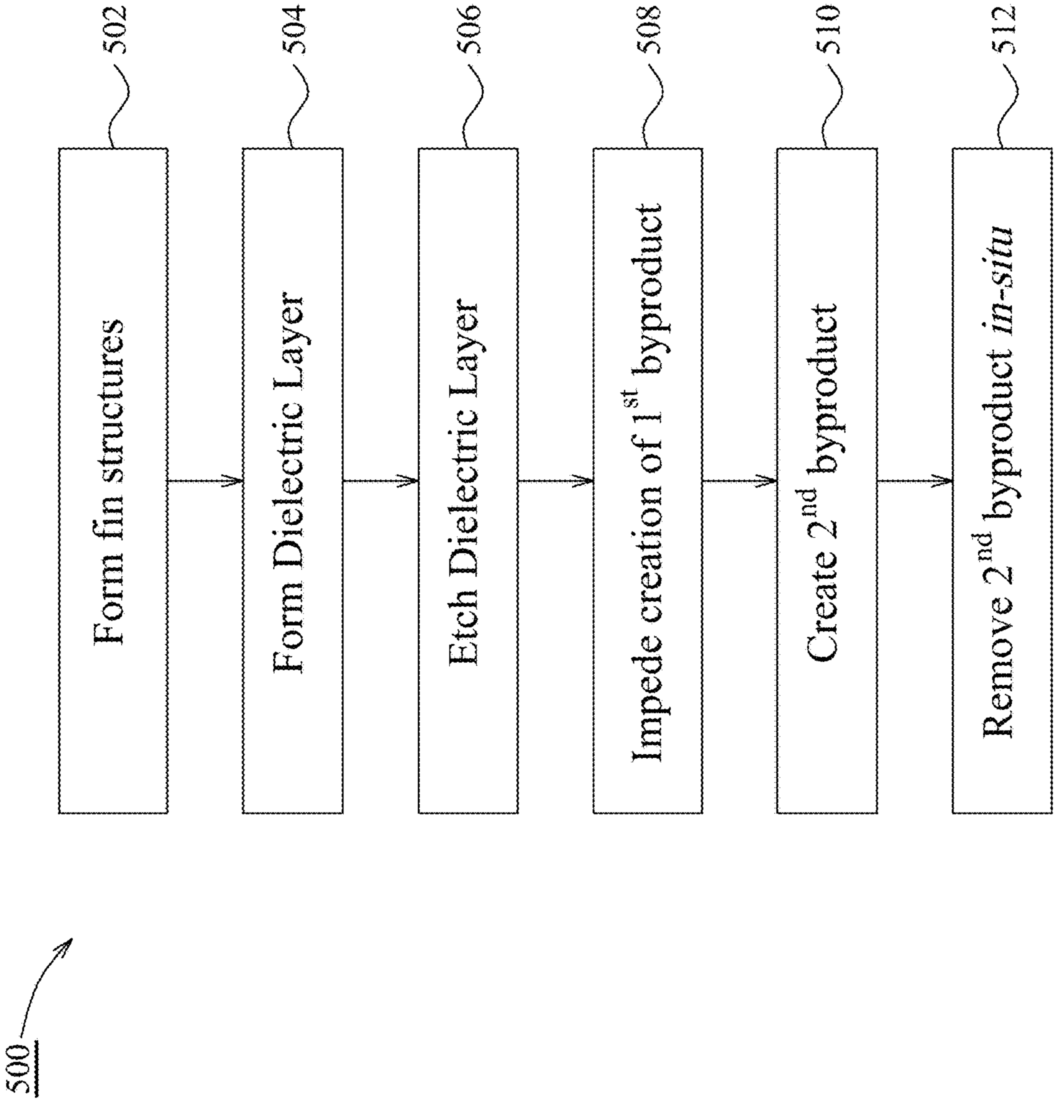

FIG. 18 is a flow diagram of a method for forming a semiconductor structure according to one embodiment. The method 500 includes several operations or steps to form a semiconductor device with an improved profile and process throughput. At operation 502, a plurality of fin structures is formed on a substrate, wherein the fin structures are spaced with each other by various sizes of gaps. At operation 504, a dielectric layer is formed over the fin structures to fill the gaps. The dielectric layer is etched with an isotropic, plasmaless dry etching process at operation 506. Creation of a first byproduct by reaction with the dielectric layer is impeded at operation 508. At operation 510, a second byproduct is created, which is then removed in-situ at operation 512.

Figure 19:
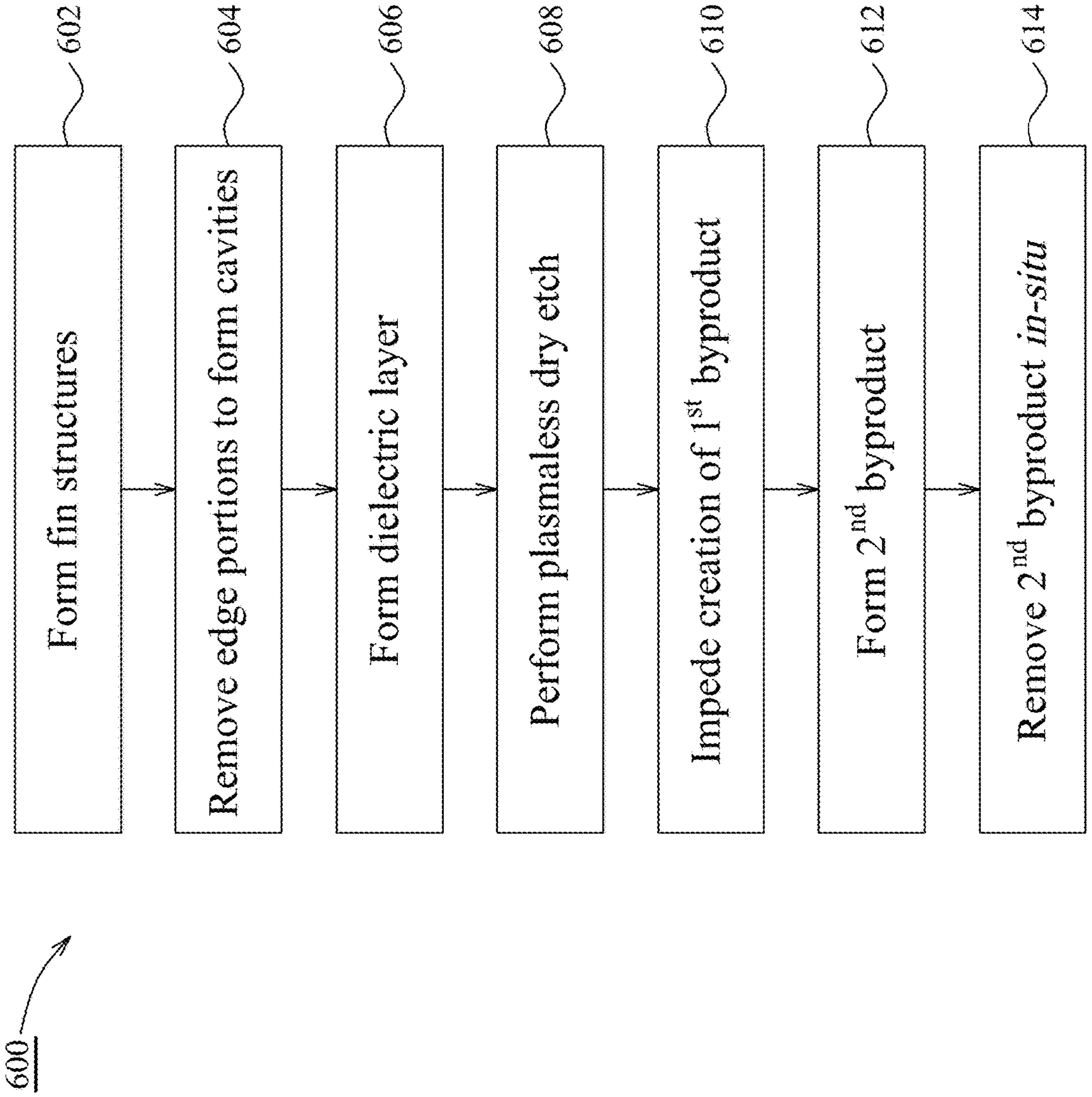

FIG. 19 is a flow diagram of a method for forming a semiconductor structure according to one embodiment. The method 600 includes several operations or steps to form a semiconductor device with an improved profile and process throughput. At operation 602, a plurality of semiconductor fins is formed on a substrate. Each of the semiconductor fins includes a stack of first semiconductor layers and second semiconductor layers alternately stacked. An edge portion of each of the second semiconductor layers is removed to form a cavity between each pair of immediately adjacent first semiconductor layers at operation 604. A dielectric layer is formed over the semiconductor fins at operation 606. The dielectric layer may fill the cavities. At operation 608, plasmaless dry etch is performed to remove the dielectric layer outside of the cavities and leaving the dielectric layer in the cavities to form an inner spacer at the sidewall of each of the second semiconductor layers. During the etching process, creation of a first byproduct from a reaction with the dielectric layer is impeded at operation 610, and a second byproduct is created at operation 612. The second byproduct may be formed from reaction between thermal gases used for etching the dielectric layer during the plasmaless dry etch. The second byproduct is then removed in-situ after the dielectric layer outside of the cavities are removed at operation 614.

According to one embodiment, a plasmaless dry etching method is provided. A semiconductor structure including a dielectric layer formed on a substrate is placed into an etching chamber to perform the plasmaless dry etching method. A main etchant gas, a first gas, and a precursor are introduced into the chamber. During the etching process, a passivation source is created to impede a first byproduct created by reaction of the main etchant gas and the first gas with the dielectric layer and a second byproduct is created by a gas phase reaction between the first gas, the precursor gas, and the main etchant.

A method for forming a semiconductor device is provided according to another embodiment. A plurality of fin structures is formed on a substrate, wherein the fin structures are spaced with each other by various sizes of gaps. A dielectric layer is formed over the fin structures to fill the gaps. An isotropic, plasmaless dry etching process is used to etch the dielectric layer. During the etching process, creation of a first byproduct from a reaction with the dielectric layer is impeded, and a second byproduct is created from reaction between thermal gases used for etching the dielectric layer. The second byproduct is in-situ removed after a predetermined thickness of the dielectric layer is removed.

In yet another embodiment, a method for forming a semiconductor device is performed, including forming a plurality of semiconductor fins on a substrate, each of the semiconductor fins includes a stack of first semiconductor layers and second semiconductor layers alternately stacked. An edge portion of each of the second semiconductor layers to form a cavity between each pair of immediately adjacent first semiconductor layers. A dielectric layer is formed over the semiconductor fins. The dielectric layer may fill the cavities. A plasmaless dry etch is performed to remove the dielectric layer outside of the cavities and leaving the dielectric layer in the cavities to form an inner spacer at the sidewall of each of the second semiconductor layers. During the etching process, creation of a first byproduct from a reaction with the dielectric layer is impeded, and a second byproduct from reaction between thermal gases used for etching the dielectric layer during the plasmaless dry etch. The second byproduct is then removed in-situ after the dielectric layer outside of the cavities are removed.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A plasmaless dry etching method, comprising:
placing a semiconductor structure in an etching chamber, the semiconductor structure includes a dielectric layer formed on a substrate;
introducing a main etchant gas into the etching chamber;
introducing a first gas and a precursor gas into the etching chamber;
creating a passivation source to impede a first byproduct created by reaction of the main etchant gas and the first gas with the dielectric layer; and
creating a second byproduct by a gas phase reaction between the first gas, the precursor gas, and the main etchant gas.

2. The method according to claim 1, wherein the dielectric layer comprises $SiO_2$, $SiO_xC_yN_z$, SiOC, SiON, SN, or other Si-containing dielectric material.

3. The method according to claim 2, wherein the main etchant gas includes HF gas.

4. The method according to claim 2, wherein the first gas includes pyridine $N(CH)_5$ gas and the precursor gas includes a gas-phase Ti precursor.

5. The method according to claim 2, further comprising introducing a second gas into the etching chamber, the second gas comprises $NH_3$ and $N(CH_3)_3$.

6. The method according to claim 4, wherein the gas-phase Ti precursor includes TiN.

7. The method according to claim 6, wherein the first byproduct includes $(C_5H_5N^+)_2SiF_6^{2-}$.

8. The method according to claim 6, wherein the second byproduct includes solid-$((NC_5H_5)_2TiF_6$.

9. The method according to claim 1, further comprising removing the second byproduct in an in-situ manner after a predetermined thickness of the dielectric layer has been removed.

10. The method according to claim 9, further comprising adding $F_2$ gas for removing the second byproduct.

11. The method according to claim 1, further comprising performing plasmaless dry etch with conditions to suppress reaction with the dielectric layer and to assist a gas phase reaction for forming the second byproduct, the conditions comprising:
a HF gas with a flow rate about 20 sccm to about 1000 sccm;
a $N(CH)_5$ gas with a flow rate about 0.1 g/min to about 3 g/min;
an $H_2$ gas with a flow rate about 20 sccm to about 1000 sccm;
an $N_2$ gas with a flow rate about 20 sccm to about 5000 sccm;

an $F_2$ gas with a flow rate about 20 sccm to about 1000 sccm; and a Ti precursor gas with a flow rate about 20 sccm to about 1000 sccm.

12. The method according to claim 1, wherein the plasmaless dry etch is performed with conditions including:

controlling a temperature of the semiconductor structure at about 25° C. to about 600° C.;

controlling a pressure of about 0.1 Torr to about 10 Torr;

adjusting a distance between the semiconductor structure and a gas entrance of the etching chamber from about 2 mm to about 100 mm.

13. The method according to claim 1, wherein the semiconductor structure includes various gap structures filled with the dielectric layer.

14. A method, comprising:

forming a plurality of fin structures on a substrate, wherein the fin structures are spaced with each other by various sizes of gaps;

forming a dielectric layer over the fin structures to fill the gaps;

etching the dielectric layer with an isotropic, plasmaless dry etching process;

impeding creation of a first byproduct from a reaction with the dielectric layer;

creating a second byproduct from reaction between thermal gases used for etching the dielectric layer; and removing the second byproduct in-situ after a predetermined thickness of the dielectric layer is removed.

15. The method according to claim 14, wherein fin structures include nanosheets.

16. The method according to claim 14, wherein the dielectric layer includes SiO-based dielectric layer.

17. The method according to claim 16, further comprising forming a passivation source between the dielectric layer, HF gas, and pyridine.

18. The method according to claim 16, wherein the thermal gases used for etching the dielectric layer include Ti precursor gas, HF gas, and pyridine gas.

19. A method, comprising:

forming a plurality of semiconductor fins on a substrate, each of the semiconductor fins includes a stack of first semiconductor layers and second semiconductor layers alternately stacked;

removing an edge portion of each of the second semiconductor layers to form a cavity at between each pair of immediately adjacent first semiconductor layers;

forming a dielectric layer over the semiconductor fins, the dielectric layer filling the cavities;

performing a plasmaless dry etch to remove the dielectric layer outside of the cavities and leaving the dielectric layer in the cavities to form an inner spacer at a sidewall of each of the second semiconductor layers;

impeding creation of a first byproduct from a reaction with the dielectric layer during the plasmaless dry etch; and creating a second byproduct from reaction between thermal gases used for etching the dielectric layer during the plasmaless dry etch; and removing the second byproduct in-situ after the dielectric layer outside of the cavities are removed.

20. A method according to claim 19, further comprising:

impeding generating a passivation source from a reaction between the dielectric layer, HF gas, and pyridine gas used for etching the dielectric layer; and creating the second byproduct from a thermal gas reaction between HF gas, puridine gas, and a Ti precursor gas.

* * * * *